(12) United States Patent
Yang

(10) Patent No.: US 9,230,673 B2
(45) Date of Patent: *Jan. 5, 2016

(54) METHOD AND APPARATUS FOR READING DATA STORED IN FLASH MEMORY BY REFERRING TO BINARY DIGIT DISTRIBUTION CHARACTERISTICS OF BIT SEQUENCES READ FROM FLASH MEMORY

(71) Applicant: Silicon Motion Inc., Hsinchu County (TW)

(72) Inventor: Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/277,007

(22) Filed: May 13, 2014

(65) Prior Publication Data

US 2014/0241067 A1    Aug. 28, 2014

Related U.S. Application Data

(63) Continuation of application No. 13/802,625, filed on Mar. 13, 2013, now Pat. No. 8,760,929, which is a continuation of application No. 13/044,548, filed on Mar. 10, 2011, now Pat. No. 8,427,875.

(60) Provisional application No. 61/420,336, filed on Dec. 7, 2010, provisional application No. 61/441,635, filed on Feb. 10, 2011.

(51) Int. Cl.
| | |
|---|---|
| *G11C 16/00* | (2006.01) |
| *G11C 16/26* | (2006.01) |
| *G11C 11/56* | (2006.01) |
| *G11C 16/04* | (2006.01) |

(52) U.S. Cl.
CPC .......... *G11C 16/26* (2013.01); *G11C 11/5642* (2013.01); *G11C 16/0483* (2013.01); *G11C 16/0475* (2013.01); *G11C 2211/5644* (2013.01); *G11C 2211/5648* (2013.01)

(58) Field of Classification Search
CPC .......... G11C 16/0483; G11C 16/0475; G11C 16/26; G11C 11/5642; G11C 2211/5644; G11C 2211/5648
USPC .............. 365/185.18, 185.03, 185.17, 185.33
See application file for complete search history.

(56) References Cited

U.S. PATENT DOCUMENTS 6,829,166 B2   12/2004  Lin
(Continued)

FOREIGN PATENT DOCUMENTS

CN         101645295 A      2/2010

OTHER PUBLICATIONS

"International Search Report" mailed on Nov. 17, 2011 for International application No. PCT/CN2011/078194, International file date:Aug. 10, 2011.

*Primary Examiner* — Tan T Nguyen
(74) *Attorney, Agent, or Firm* — Winston Hsu; Scott Margo

(57) ABSTRACT

A method for reading data stored in a flash memory includes at least the following steps: controlling the flash memory to perform a plurality of read operations upon a plurality of memory cells included in the flash memory; obtaining a plurality of bit sequences read from the memory cells, respectively, wherein the read operations read bits of a predetermined bit order from the memory cells by utilizing different control gate voltage settings; and determining readout information of the memory cells according to binary digit distribution characteristics of the bit sequences.

18 Claims, 22 Drawing Sheets

(56) References Cited

U.S. PATENT DOCUMENTS

| | | |
|---|---|---|
| 6,879,535 B1 | 4/2005 | Perisetty |
| 7,558,109 B2 | 7/2009 | Brandman |
| 7,773,419 B2 | 8/2010 | Nam |
| 7,800,943 B2 | 9/2010 | Ravasio |
| 8,427,875 B2 | 4/2013 | Yang |
| 2008/0117685 A1 | 5/2008 | Syzdek |
| 2008/0158985 A1 | 7/2008 | Mokhlesi |
| 2010/0034018 A1 | 2/2010 | Yang |
| 2010/0046302 A1 | 2/2010 | Ogura |
| 2010/0103731 A1 | 4/2010 | Yoo |

METHOD AND APPARATUS FOR READING DATA STORED IN FLASH MEMORY BY REFERRING TO BINARY DIGIT DISTRIBUTION CHARACTERISTICS OF BIT SEQUENCES READ FROM FLASH MEMORY

CROSS REFERENCE TO RELATED APPLICATIONS

This is a continuation of the co-pending U.S. application Ser. No. 13/802,625 (filed on Mar. 13, 2013), which is a continuation of the U.S. application Ser. No. 13/044,548 (filed on Mar. 10, 2011), which claims the benefit of U.S. provisional application No. 61/420,336 (filed on Dec. 7, 2010) and U.S. provisional application No. 61/441,635 (filed on Feb. 10, 2011). The entire content of the related applications is incorporated herein by reference.

BACKGROUND OF THE INVENTION

1. Field of the Invention

The disclosed embodiments of the present invention relate to reading data stored in a flash memory, and more particularly, to a method and memory controller for reading data stored in a flash memory by referring to binary digit distribution characteristics of bit sequences read from memory cells of the flash memory.

2. Description of the Prior Art

Flash memory can be electrically erased and programmed for data storage. It is widely used in memory cards, solid-state drives, portable multimedia players, etc. As the flash memory is a non-volatile memory, no power is needed to maintain the information stored in the flash memory. Besides, the flash memory offers fast read access and better shock resistance. These characteristics explain the popularity of the flash memory.

The flash memories may be categorized into NOR-type flash memories and NAND-type flash memories. Regarding the NAND flash memory, it has reduced erasing and programming time and requires less chip area per cell, thus allowing greater storage density and lower cost per bit than the NOR flash memory. In general, the flash memory stores data in an array of memory cells made from floating-gate transistors. Each memory cell can store one bit of information or more than one bit of information by adequately controlling the number of electrical charge on its floating gate to configure the threshold voltage required for turning on the memory cell made of a floating-gate transistor. In this way, when one or more predetermined control gate voltages are applied to a control gate of the floating-gate transistor, the conductive status of the floating-gate transistor would indicate the binary digit(s) stored by the floating-gate transistor.

However, due to certain factors, the number of electrical charge originally stored on one flash memory cell may be affected/disturbed. For example, the interference presented in the flash memory may be originated from write (program) disturbance, read disturbance, and/or retention disturbance. Taking a NAND flash memory including memory cells each storing more than one bit of information for example, one physical page includes multiple logical pages, and each of the logical pages is read by using one or more control gate voltages. For instance, regarding one flash memory cell which is configured to store three bits of information, the flash memory cell may have one of eight possible states (i.e., electrical charge levels) corresponding to different electrical charge amounts (i.e., different threshold voltages), respectively. However, due to the increase of the program/erase (P/E) count and/or the retention time, the threshold voltage distribution of memory cells in the flash memory may be changed. Thus, using original control gate voltage setting (i.e., threshold voltage setting) to read the stored bits from the memory cell may fail to obtain the correct stored information due to the changed threshold voltage distribution.

SUMMARY OF THE INVENTION

In accordance with exemplary embodiments of the present invention, a method and memory controller for reading data stored in a flash memory by referring to binary digit distribution characteristics of bit sequences read from memory cells of the flash memory are proposed to solve the above-mentioned problem.

According to a first aspect of the present invention, an exemplary method for reading data stored in a flash memory is disclosed. The exemplary method includes: controlling the flash memory to perform a plurality of read operations upon a plurality of memory cells included in the flash memory; obtaining a plurality of bit sequences read from the memory cells, respectively, wherein the read operations read bits of a predetermined bit order from the memory cells by utilizing different control gate voltage settings; and determining readout information of the memory cells according to binary digit distribution characteristics of the bit sequences.

According to a second aspect of the present invention, an exemplary method of accessing data in a flash memory including a plurality of memory cells is disclosed. The exemplary method includes: determining binary digit distribution characteristics of bit sequences read from the plurality of memory cells; and determining readout information in accordance with the binary digit distribution characteristics.

According to a third aspect of the present invention, an exemplary apparatus for reading data stored in a flash memory having a plurality of memory cells is disclosed. The exemplary apparatus includes: a receiver for receiving a plurality of bit sequences read from the plurality of memory cells; and a controller coupled to the receiver for causing the flash memory to perform a read operation at each of the plurality of memory cells and for determining readout information from the plurality of memory cells in accordance with binary digit distribution characteristics of the plurality of bit sequences.

According to a fourth aspect of the present invention, an exemplary method for reading data stored in a flash memory is disclosed. The exemplary method includes: controlling the flash memory to perform a plurality of read operations upon a plurality of memory cells included in the flash memory; obtaining a plurality of bit sequences read from the memory cells; obtaining a mapping rule according to the bit sequences; and obtaining readout information of the memory cells according to the mapping rule and the bit sequences.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The generalized conception of the present invention is to read data stored in a flash memory by controlling the flash memory to perform a plurality of read operations upon each of a plurality of memory cells included in the flash memory (it should be noted that the read operations read bits of a predetermined bit order from each of the memory cells as one of the bit sequences by utilizing different control gate voltage settings), obtaining a plurality of bit sequences read from the memory cells, respectively, and determining readout information of the memory cells according to binary digit distribution characteristics of the bit sequences. Further details are described as follows.

Please note that the threshold voltage distribution illustrated in the accompanying figures and values of the control gate voltages mentioned hereinafter are for illustrative purposes only, and are not meant to be limitations of the present invention. Besides, for simplicity and clarity, reading multiple bits stored by memory cells of one physical page in a NAND-type flash memory is taken as an example for illustrating technical features of the present invention. However, no matter whether the flash memory is a NAND-type flash memory or a flash memory of other type (e.g., a NOR-type flash memory), the spirit of the present invention is obeyed as long as binary digit distribution characteristics of bit sequences read from memory cells are used for determining readout information of the memory cells.

Figure 1:
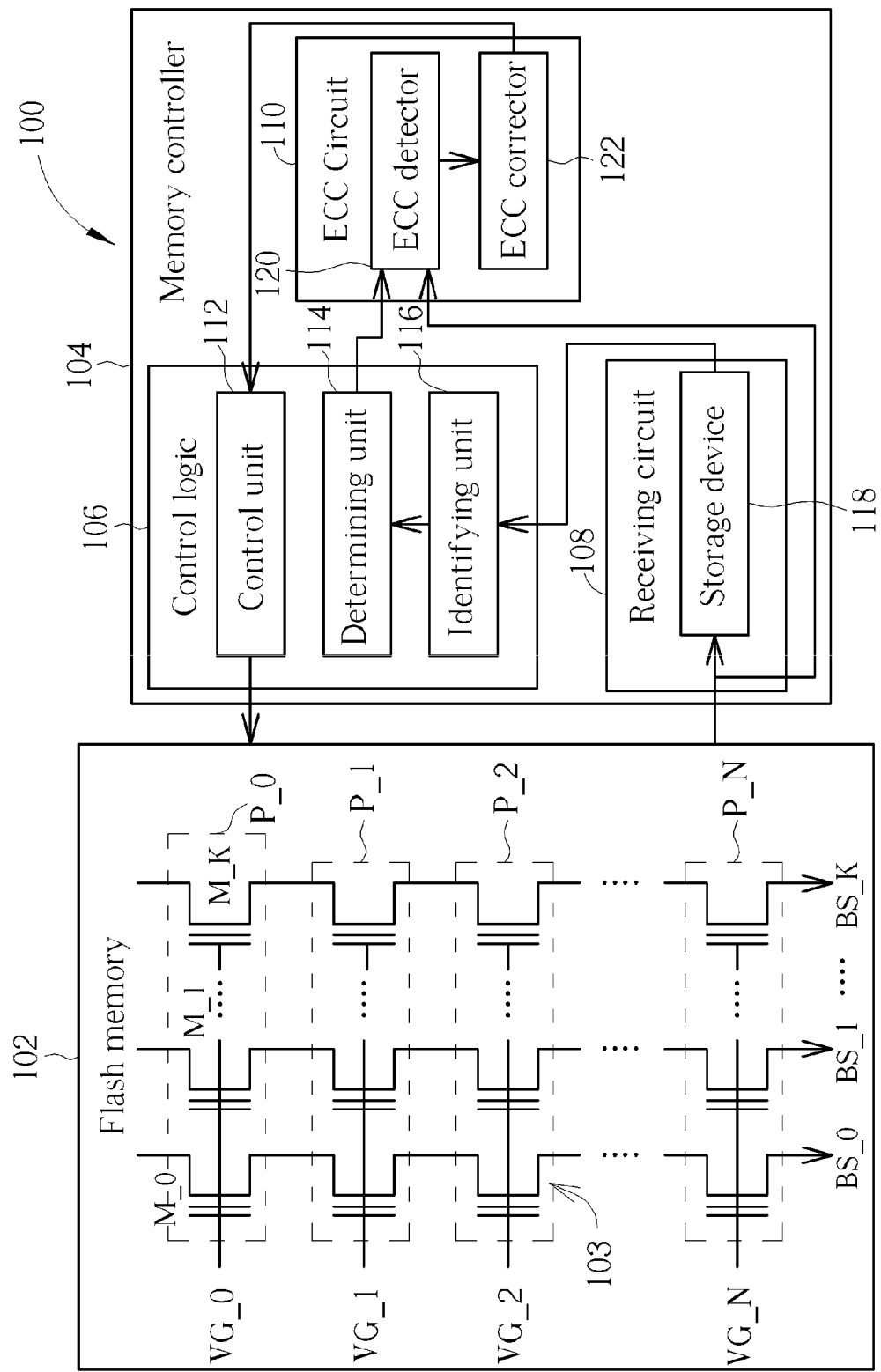
FIG. 1 is a diagram illustrating a memory system according to a first exemplary embodiment of the present invention.

Please refer to FIG. 1, which is a diagram illustrating a memory system according to a first exemplary embodiment of the present invention. The exemplary memory system 100 includes a flash memory 102 and a memory controller 104. In this exemplary embodiment, the flash memory 102 may be a NAND-type flash memory including a plurality of physical pages P_0, P_1, P_2, . . . , P_N, wherein each of the physical pages P_0-P_N includes a plurality of memory cells (e.g., floating-gate transistors) 103. For example, as to a target physical page P_0 to be read, it has memory cells M_0-M_K included therein. To read the data stored in the memory cells M_0-M_K of the target physical page P_0, the control gate voltages VG_0-VG_N should be properly set. For example, the control gate voltages VG_1-VG_N should be properly set to ensure that all of the memory cells (floating-gate transistors) 103 of the physical pages P_1-P_N are conductive. In a case where each of the memory cell 103 is configured to store N bits (e.g., three bits including a least significant bit (LSB), a central significant bit (CSB), and a most significant bit (MSB)), the flash memory 102 sets the control gate voltage VG_0 to $(2^N-1)$ voltage levels for identifying all of the N bits of each memory cell 103 of the target physical page P_0.

Figure 2:
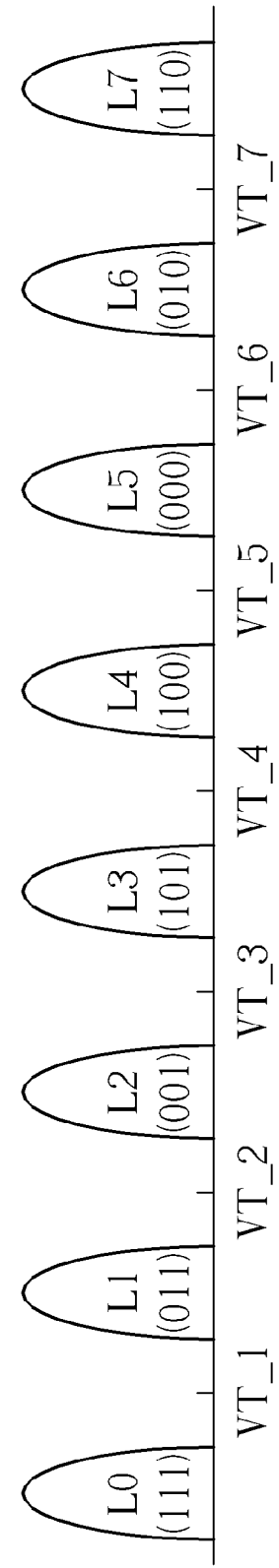
FIG. 2 is a diagram illustrating a first exemplary threshold voltage distribution of a target physical page to be read.

Please refer to FIG. 2, which is a diagram illustrating a first exemplary threshold voltage distribution of the physical page P_0 to be read. The memory cells M_0-M_K of the physical page P_0 may include memory cells with floating gates programmed to have an electrical charge level L0 (i.e., (MSB, CSB, LSB)=(1, 1, 1)), memory cells with floating gates programmed to have an electrical charge level L1 (i.e., (MSB, CSB, LSB)=(0, 1, 1)), memory cells with floating gates programmed to have an electrical charge level L2 (i.e., (MSB, CSB, LSB)=(0, 0, 1)), memory cells with floating gates programmed to have an electrical charge level L3 (i.e., (MSB, CSB, LSB)=(1, 0, 1)), memory cells with floating gates programmed to have an electrical level L4 (i.e., (MSB, CSB, LSB)=(1, 0, 0)), memory cells with floating gates programmed to have an electrical level L5 (i.e., (MSB, CSB, LSB)=(0, 0, 0)), memory cells with floating gates programmed to have an electrical charge level L6 (i.e., (MSB, CSB, LSB)=(0, 1, 0)), and memory cells with floating gates programmed to have an electrical charge level L7 (i.e., (MSB, CSB, LSB)=(1, 1, 0)).

To identify LSBs of the memory cells M_0-M_K, the flash memory 102 sets the control gate voltage VG_0 by the threshold voltage VT_4 shown in FIG. 2. Next, the conductive state of each memory cell of the target physical page P_0 indicates whether the memory cell has an LSB being "0" or "1". In this exemplary embodiment, when a memory cell of the physical page P_0 is turned on by the threshold voltage VT_4 applied to its control gate, the flash memory 102 will output one binary digit "1" representative of the LSB; otherwise, the flash memory 102 will output the other binary digit "0" representative of the LSB.

To identify CSBs of the memory cells M_0-M_K, the flash memory 102 sets the control gate voltage VG_0 by the threshold voltages VT_2 and VT_6 shown in FIG. 2, respectively. Similarly, the conductive state of each memory cell of the target physical page P_0 indicates whether the memory cell 103 has a CSB being "0" or "1". In this exemplary embodiment, when the memory cell is turned on by any of the threshold voltages VT_2 and VT_6 applied to its control gate, the flash memory 102 will output the binary digit "1" representative of the CSB; when the memory cell is not turned on by the threshold voltage VT_2 applied to its control gate and is turned on by the other threshold voltage VT_6 applied to its control gate, the flash memory 102 will output the binary digit "0" representative of the CSB; and when the memory cell is neither turned on by the threshold voltage VT_2 applied to its control gate nor turned on by the other threshold voltage VT_6 applied to its control gate, the flash memory 102 will output the binary digit "1" representative of the CSB.

Figure 3:
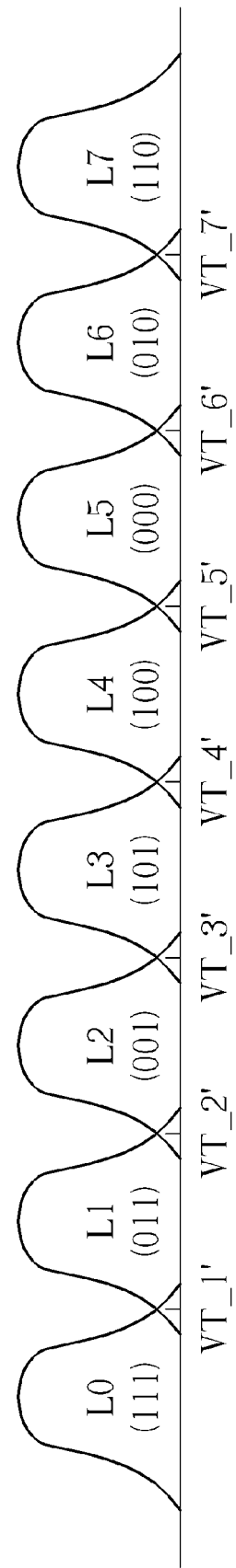
FIG. 3 is a diagram illustrating a second exemplary threshold voltage distribution of the target physical page to be read.

To identify MSBs of the memory cells M_0-M_K, the flash memory 102 sets the control gate voltage VG_0 by the threshold voltages VT_1, VT_3, VT_5, and VT_7 shown in FIG. 2, respectively. Similarly, the conductive state of each memory cell of the target physical page P_0 indicates whether the memory cell has an MSB being "0" or "1". In this exemplary embodiment, when the memory cell is turned on by any of the threshold voltages VT_1, VT_3, VT_5, and VT_7 applied to its control gate, the flash memory 102 will output the binary digit "1" representative of the MSB; when the memory cell is not turned on by the threshold voltage VT_1 applied to its control gate and is turned on by any of the threshold voltages VT_3, VT_5, and VT_7 applied to its control gate, the flash memory 102 will output the binary digit "0" representative of the MSB; when the memory cell is not turned on by any of the threshold voltages VT_1 and VT_3 applied to its control gate and is turned on by any of the threshold voltages VT_5 and VT_7 applied to its control gate, the flash memory 102 will output the binary digit "1" representative of the MSB; when the memory cell is not turned on by any of the threshold voltages VT_1, VT_3, and VT_5 applied to its control gate and is turned on by the threshold voltage VT_7 applied to its control gate, the flash memory 102 will output the binary digit "0" representative of the MSB; and when the memory cell is not turned on by any of the threshold voltages VT_1, VT_3, VT_5, and VT_7 applied to its control gate, the flash memory 102 will output the binary digit "1" representative of the MSB;

However, the threshold voltage distribution shown in FIG. 2 may be changed to become another threshold voltage distribution die to certain factors such as the increase of the P/E count and/or the retention time. For example, the lobe-shaped distribution corresponding to each electrical charge level may be widened and/or shifted. Please refer to FIG. 3, which is a diagram illustrating a second exemplary threshold voltage distribution of the physical page P_0 to be read. As can be seen from FIG. 3, the threshold voltage distribution is different from that shown in FIG. 2. Setting the control gate voltage VG_0 by the aforementioned threshold voltages VT_1-VT_7 may fail to obtain the correct LSBs, CSBs, and MSBs of the memory cells M_0-M_K of the target physical page P_0. Specifically, when the memory cells M_0-M_K have the threshold voltage distribution shown in FIG. 3, new threshold voltages VT_1'-VT_7' should be used for obtaining the stored information correctly. As a result, an error correction code (ECC) operation performed upon the codeword read from memory cells M_0-M_K may fail due to uncorrectable errors presented in the codeword. In this exemplary embodiment, the memory controller 104 is devised to adaptively track the threshold voltage distribution for reducing/eliminating uncorrectable errors presented in the codeword read from memory cells of the physical page.

Please refer to FIG. 1 again. The memory controller 104 is implemented to control access (read/write) of the flash memory 102, and includes, but is not limited to, a control logic 106 having a control unit 112, a determining unit 114, and an identifying unit 116 included therein, a receiving circuit 108, and an ECC circuit 110. Please note that only the elements pertinent to the technical features of the present invention are shown in FIG. 1. That is, the memory controller 104 may include additional elements to support other functionality. Generally, when receiving a read request for data stored in the memory cells M_0-M_K of the target physical page P_0, the control logic 106 is operative for controlling the flash memory 102 to read requested data. Next, when the flash memory 102 successfully identifies all bits stored in each of the memory cells M_0-M_K, the readout information which includes identified bits of the memory cells M_0-M_K is received by the receiving circuit 108. As shown in FIG. 1, the receiving circuit 108 has a storage device (e.g., a memory device) 118 acting as a data buffer for temporarily storing the readout information generated from the flash memory 102. As known to those skilled in the art, part of the memory cells 103 of one physical page is utilized for storing ECC information (e.g., an ECC code). Thus, the ECC circuit 110 is operative to perform an ECC operation upon the readout information (e.g., a codeword) read from the physical page. In this exemplary embodiment, the ECC circuit 110 includes an ECC detector 120 and an ECC corrector 122. The ECC detector 120 is implemented for checking the correctness of the readout information, thereby detecting the existence of any error bits. When notified by the ECC detector 120, the ECC corrector 122 is operative for correcting error bits found in the checked readout information. However, when the number of error bits existing in the readout information exceeds a maximum number of error bits that can be corrected by the ECC corrector 122, the ECC corrector 122 indicates that the readout information includes uncorrectable error bits. Thus, the control logic 106 will enable the threshold voltage distribution tracking mechanism proposed in the present invention to determine the readout information which can pass the ECC parity check performed by the ECC circuit 110. Details are described as below.

In this exemplary embodiment, the ECC circuit 110 may be implemented by a low density parity-check (LDPC) decoder. The control logic 106 controls the flash memory 102 to provide soft information to be decoded by the LDPC decoder. In other words, the aforementioned readout information generated from reading the memory cells M_0-M_K is soft information. Therefore, under the control of the control logic 106, the flash memory 102 outputs multiple binary digits to serve as one soft bit read from each of the memory cells M_0-M_K. Specifically, the control logic 106 is arranged for controlling the flash memory 102 to perform a plurality of read operations (e.g., seven read operations) upon each of the memory cells M_0-M_K of the target physical page P_0 when reading LSB data, CSB data, or MSB data. Please note that each read operation performed upon the memory cell may utilize a control gate voltage setting including one or more control gate voltages applied to a control gate of the memory cell; in addition, different read operations may utilize different control gate voltage settings. For example, a read operation for LSB data utilizes a gate voltage setting including one control gate voltage, a read operation for CSB data utilizes a gate voltage setting including two control gate voltages, and a read operation for MSB data utilizes a gate voltage setting including four control gate voltages. The receiving circuit 108 is coupled to the control logic 106, and arranged for obtaining a plurality of bit sequences BS_0, BS_1, . . . , BS_K read from the memory cells M_0-M_K, respectively, wherein the read operations read bits of a predetermined bit order (e.g., LSBs, CSBs, or MSBs) from each of the memory cells M_0-M_K as one of the bit sequences by utilizing different control gate voltage settings, and the bit sequences BS_0-BS_K may be buffered in the storage device 118 of the receiving circuit 108 for further processing.

Figure 4:
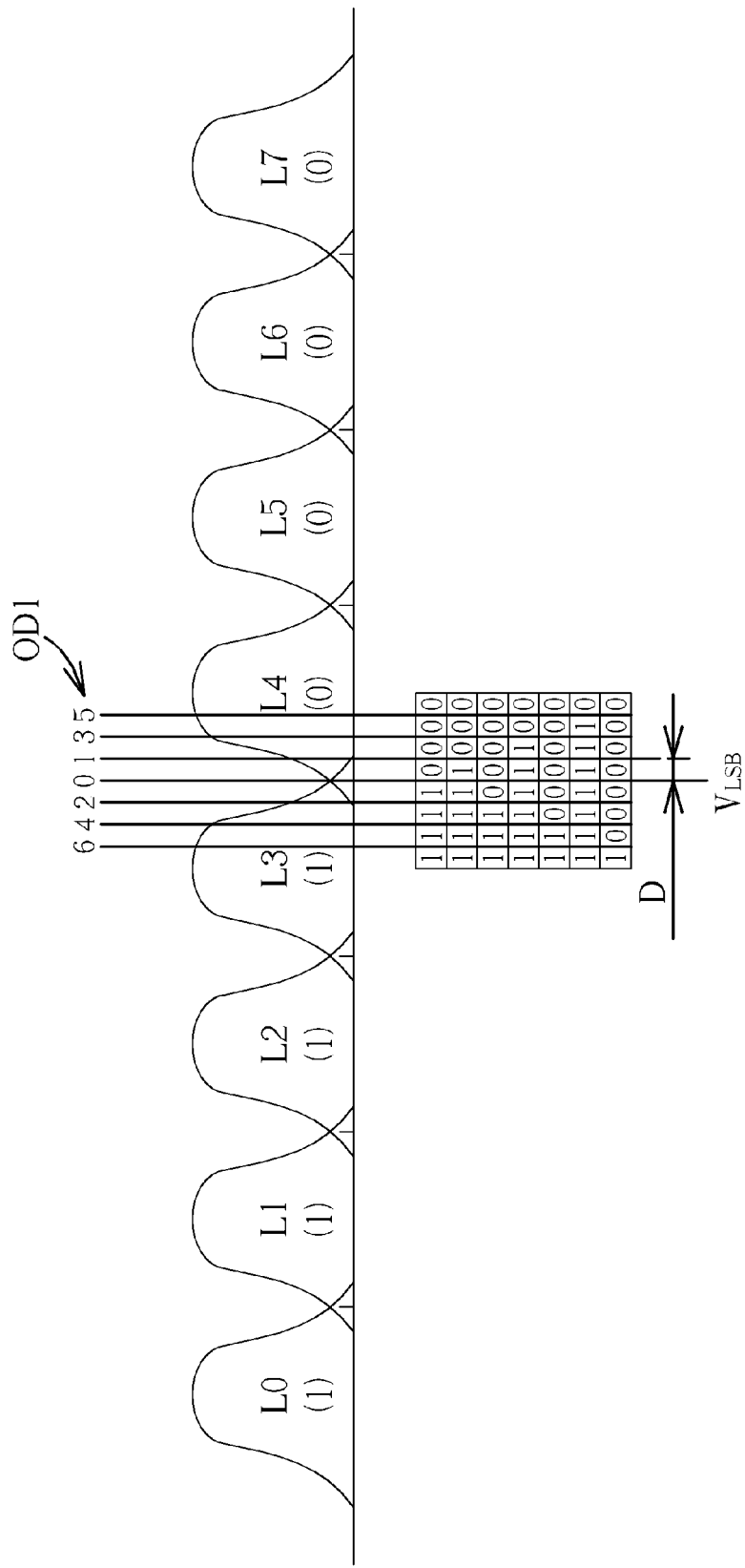
FIG. 4 is a diagram illustrating an exemplary LSB reading operation of reading a soft bit (i.e., a soft information value) from a memory cell of the flash memory.

Please refer to FIG. 4, which is a diagram illustrating an exemplary LSB reading operation of reading a soft bit (i.e., a soft information value) from a memory cell of the flash memory 102. In accordance with the exemplary threshold voltage distributions shown in FIG. 2 and FIG. 3, a memory cell with any of the electrical charge levels L0-L3 would store LSB=1, and a memory cell with any of the electrical charge levels L4-L7 would store LSB=0. In this exemplary embodiment, the control unit 112 determines an initial control gate voltage $V_{LSB}$ and a voltage spacing D, and then controls the flash memory 102 to perform seven read operations upon each of the memory cells M_0-M_K. Based on the voltage adjusting order OD1, the flash memory 102 sets the control gate voltage VG_0 by $V_{LSB}$, $V_{LSB}$+D, $V_{LSB}$−D, $V_{LSB}$+2D, $V_{LSB}$−2D, $V_{LSB}$+3D, $V_{LSB}$−3D, sequentially. Therefore, each of the bit sequences BS_0-BS_M would have seven binary digits sequentially obtained due to the applied control gate voltages $V_{LSB}$, $V_{LSB}$+D, $V_{LSB}$−D, $V_{LSB}$+2D, $V_{LSB}$−2D, $V_{LSB}$+3D and $V_{LSB}$−3D. Please note that each of the bit sequences BS_0-BS_M acts as a soft bit representative of the soft information read from a memory cell, and the binary digit obtained due to the initial control gate voltage $V_{LSB}$ may serve as a sign bit (i.e., a hard bit value).

In this exemplary embodiment, each bit sequence may have one of eight possible binary digit combinations BS1-BS8. When the electrical charge currently stored on the floating gate of the memory cell makes the threshold voltage of the memory cell higher than $V_{LSB}$+3D, the bit sequence read from the memory cell would have the binary digit combination BS8="0000000". When the electrical charge currently stored on the floating gate of the memory cell makes the threshold voltage of the memory cell located between $V_{LSB}$+2D and $V_{LSB}$+3D, the bit sequence read from the memory cell would have the binary digit combination BS7="0000010". When the electrical charge currently stored on the floating gate of the memory cell makes the threshold voltage of the memory cell located between $V_{LSB}$+D and $V_{LSB}$+2D, the bit sequence read from the memory cell would have the binary digit combination BS6="0001010". When the electrical charge currently stored on the floating gate of the memory cell makes the threshold voltage of the memory cell located between $V_{LSB}$ and $V_{LSB}$+D, the bit sequence read from the memory cell would have the binary digit combination BS5="0101010". When the electrical charge currently stored on the floating gate of the memory cell makes the threshold voltage of the memory cell lower than $V_{LSB}$−3D, the bit sequence read from the memory cell would have the binary digit combination BS1="1111111". When the electrical charge currently stored on the floating gate of the memory cell makes the threshold voltage of the memory cell located between $V_{LSB}$−2D and $V_{LSB}$−3D, the bit sequence read from the memory cell would have the binary digit combination BS2="1111110". When the electrical charge currently stored on the floating gate of the memory cell makes the threshold voltage of the memory cell located between $V_{LSB}$−D and $V_{LSB}$−2D, the bit sequence read from the memory cell would have the binary digit combination BS3="1111010". When the electrical charge currently stored on the floating gate of the memory cell makes the threshold voltage of the memory cell located between $V_{LSB}$ and $V_{LSB}$−D, the bit sequence read from the memory cell would have the binary digit combination BS4="1101010".

When all of the binary digits included in a bit sequence are 1's, this means that the corresponding memory cell has the electrical charge level L0, L1, L2, or L3, and the reliability of LSB=1 may be high. When all of the binary digits included in a bit sequence are 0's, this means that the corresponding memory cell has the electrical charge level L5, L6, L7, or L8, and the reliability of LSB=0 may be high. However, when a bit sequence has different binary digits "0" and "1" included therein, this means that the corresponding memory cell has the electrical charge level L3 or L4. As the threshold voltage of the corresponding memory cell is between $V_{LSB}$−3D and $V_{LSB}$+3D, the reliability of LSB=1/LSB=0 may be low due to the fact that the error probability may be high. For example, a memory cell which originally stores LSB=0 would have an amount of stored electrical charge corresponding to the electrical charge level L4 to make the threshold voltage higher than $V_{LSB}$+3D. However, when the P/E count/retention time is increased, the amount of stored electrical charge is changed, which may make the threshold voltage lower than $V_{LSB}$. Similarly, a memory cell which originally stores LSB=1 would have an amount of stored electrical charge corresponding to the electrical charge level L3 to make the threshold voltage lower than $V_{LSB}$−3D. However, when the P/E count/retention time is increased, the amount of stored electrical charge is changed, which may make the threshold voltage higher than $V_{LSB}$. To put it simply, when the threshold voltage distribution is changed, a memory cell which originally stores LSB=1 may be erroneously regarded as a memory cell which stores LSB=0, and a memory cell which originally stores LSB=0 may be erroneously regarded as a memory cell which stores LSB=1.

Therefore, the bit sequences each having one of the binary digit combinations BS2-BS7 should be monitored to track the threshold voltage distribution variation around the initial control gate voltage $V_{LSB}$ (i.e., the threshold voltage distribution variation between the electrical charge levels L3 and L4). The identifying unit 116 is therefore arranged for identifying a specific bit sequence of at least one specific memory cell, wherein each specific bit sequence has different binary digits "1" and "0" included therein. The determining unit 114 is coupled to the identifying unit, and arranged for determining an updated bit sequence of the at least one specific memory cell according to at least the specific bit sequence. By way of example, the determining unit 114 determines the updated bit sequence of the at least one specific memory cell by mapping the specific bit sequence to the updated bit sequence.

Figure 5:
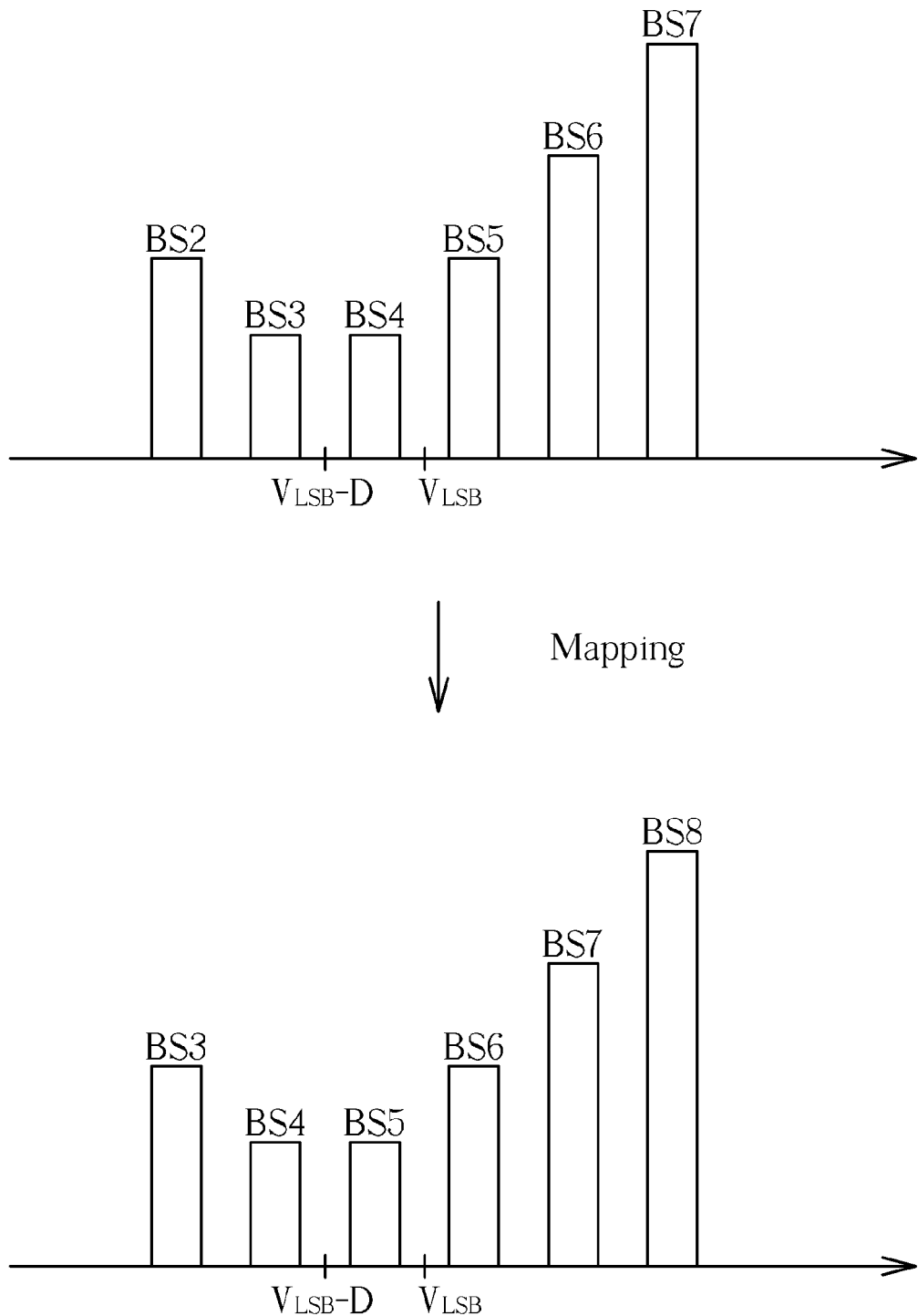
FIG. 5 is a diagram illustrating a mapping operation performed by the determining unit shown in FIG. 1 for determining updated specific bit sequences.

Please refer to FIG. 5, which is a diagram illustrating a mapping operation performed by the determining unit 114 shown in FIG. 1 for determining updated specific bit sequences. The bit sequences BS_0-BS_K generated from memory cells M_0-M_K of the target physical page P_0 are also stored into the storage device 108 acting as a data buffer. When the ECC corrector 122 indicates that the bit sequences BS_0-BS_K include uncorrectable error bits, the identifying unit 116 is operative to monitor the bit sequences BS_0-BS_K and identify specific bit sequences each having different binary digits "0" and "1" included therein (i.e., specific bit sequences each having the binary digit combination BS2, BS3, BS4, BS5, BS6, or BS7). In this exemplary embodiment, the determining unit 114 determines a mapping rule according to the specific bit sequences identified by the identifying unit 116. For example, the determining unit 114 may count specific bit sequences having the binary digit combinations BS2, BS3, BS4, BS5, BS6, and BS7 and then derive a histogram shown in FIG. 5. As can be seen from the illustrated histogram, the local minimum of the threshold voltage distribution corresponds to the shifted control gate voltage $V_{LSB}$–D rather than the initial control gate voltage $V_{LSB}$, implying that the initial control gate voltage $V_{LSB}$ is no longer the optimum control gate voltage for identifying LSBs of memory cells due to change of the threshold voltage distribution. Regarding the changed threshold voltage distribution, the shifted control gate voltage $V_{LSB}$–D would be a better control gate voltage for identifying LSBs of memory cells. Therefore, based on the histogram of the specific bit sequences identified by the identifying unit 116, the determining unit 114 is capable of determining the desired mapping rule. For example, in accordance with the relationship between the initial control gate voltage $V_{LSB}$ and the shifted control gate voltage $V_{LSB}$–D, the mapping rule will define that each specific bit sequence having the binary digit combination BS2 should be adjusted to have the binary digit combination BS3 (i.e., mapped to the binary digit combination BS3), each specific bit sequence having the binary digit combination BS3 should be adjusted to have the binary digit combination BS4 (i.e., mapped to the binary digit combination BS4), each specific bit sequence having the binary digit combination BS4 should be adjusted to have the binary digit combination BS5 (i.e., mapped to the binary digit combination BS5), each specific bit sequence having the binary digit combination BS5 should be adjusted to have the binary digit combination BS6 (i.e., mapped to the binary digit combination BS6), each specific bit sequence having the binary digit combination BS6 should be adjusted to have the binary digit combination BS7 (i.e., mapped to the binary digit combination BS7), and each specific bit sequence having the binary digit combination BS7 should be adjusted to have the binary digit combination BS8 (i.e., mapped to the binary digit combination BS8). In this way, the error probability of the updated specific bit sequence is effectively lowered due to the adjustment made to the original binary digit combination.

Next, the bit sequences BS_0-BS_K with one or more bit sequences updated/adjusted by the determining unit 114 according to the mapping rule are processed by the ECC circuit (e.g., an LDPC decoder) 110 again. As the number of error bits can be reduced by the determining unit 114 collaborating with the identifying unit 116, the ECC circuit 110 may have chance to successfully correct any error bits found in the currently processed readout information (i.e., soft information) of the physical page P_0. When the ECC corrector 122 indicates that the decoded result generated from the ECC circuit 110 is error-free, the read operation of reading LSB data of the memory cells M_0-M_K of the target physical page P_0 is accomplished. On the other hand, when the ECC corrector 122 indicates that the currently processed readout information still contains uncorrectable error bits, the determining unit 116 may further adjust the mapping rule for reducing the error probability of the specific bit sequence identified by the identifying unit 116.

In above exemplary embodiment, the determining unit 114 performs the mapping operation to update the specific bit sequences identified by the identifying unit 116. However, this is for illustrative purposes only, and is not meant to be a limitation of the present invention. In an alternative design, after the determining unit 144 determines that the shifted control gate voltage $V_{LSB}$–D should be the optimum control gate voltage for identifying LSBs of memory cells M_0-M_K, the control unit 106 may be configured to set the initial control gate voltage by $V_{LSB}$–D, and then control the flash memory 102 to perform seven read operations upon each of the memory cells M_0-M_K according to the updated initial control gate voltage $V_{LSB}$–D and the voltage spacing D. Based on the same voltage adjusting order OD1, the flash memory 102 sets the control gate voltage VG_0 by $V_{LSB}$–D, $V_{LSB}$, $V_{LSB}$–2D, $V_{LSB}$+D, $V_{LSB}$–3D, $V_{LSB}$+2D, $V_{LSB}$–4D, sequentially. Therefore, the flash memory 102 outputs new bit sequences BS_0-BS_M, wherein each of the new bit sequences BS_0-BS_M has seven binary digits sequentially obtained due to the control gate voltages $V_{LSB}$–D, $V_{LSB}$, $V_{LSB}$–2D, $V_{LSB}$+D, $V_{LSB}$–3D, $V_{LSB}$+2D and $V_{LSB}$–4D. Next, the ECC circuit (e.g., an LDPC decoder) 110 processes the new bit sequences BS_0-BS_M (i.e., an updated codeword read from the physical page P_0) to correct any error bits found in the new bit sequences BS_0-BS_M. The same objective of generating readout information which can pass the ECC parity check is achieved.

Briefly summarized, in a case where each read operation utilizes only one control gate voltage applied to a control gate of each of the memory cells, and the control gate voltage utilized by one read operation is different from the control gate voltage utilized by another read operation, the identifying unit 116 is implemented for identifying any specific bit sequence having different binary digits included therein, and the determining unit 114 is implemented for determining updated specific bit sequence (s) according to the specific bit sequence (s) identified by the identifying unit 116. In one exemplary design, the determining unit 114 determines the updated bit sequences by performing a mapping operation upon the specific bit sequences. In another exemplary design, the determining unit 114 determines a new initial control gate voltage, and the control unit 112 refers to the new initial control gate voltage to control the flash memory 102 to output bit sequences having updated specific bit sequence (s) included therein.

Figure 6:
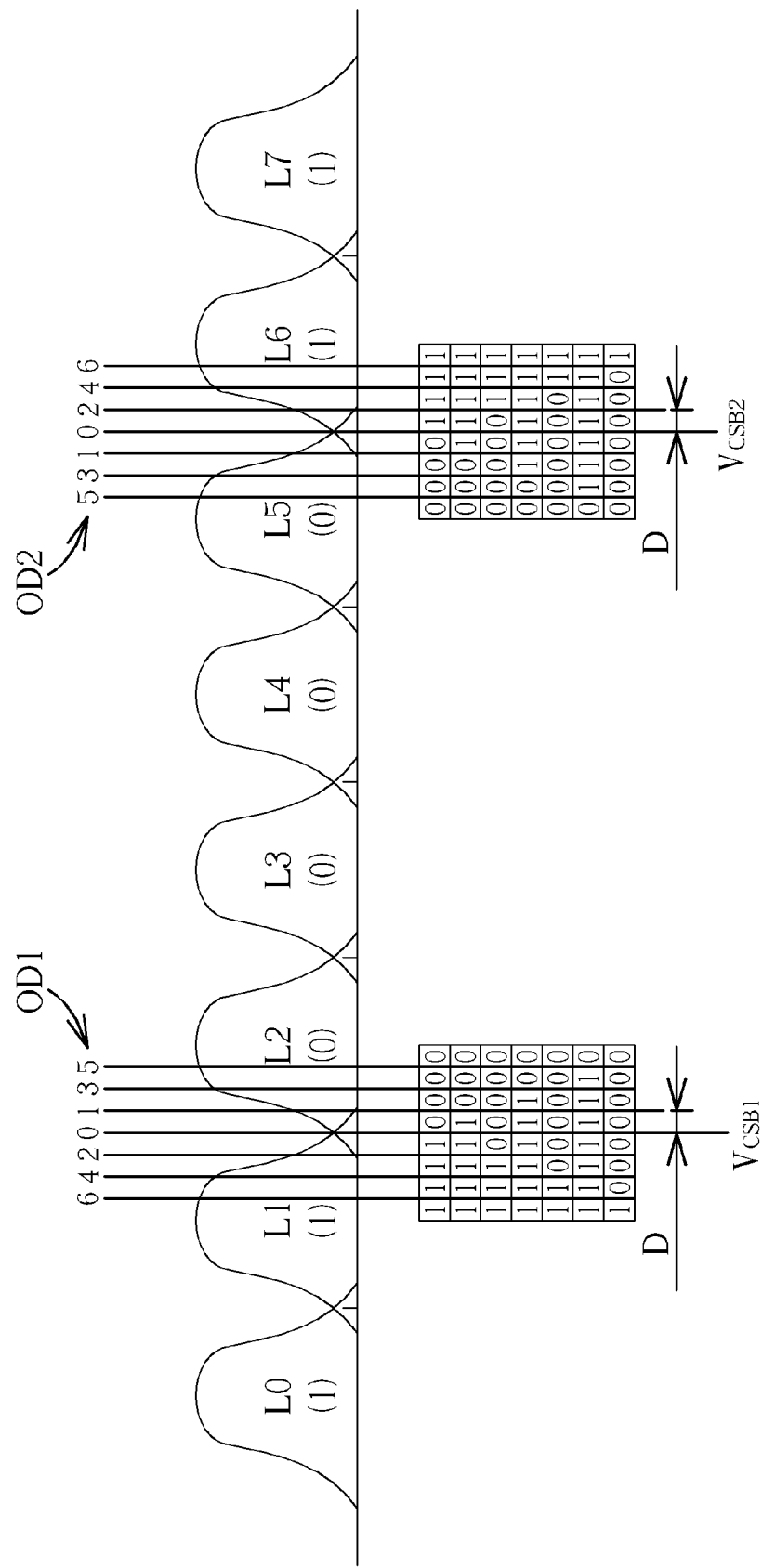
FIG. 6 is a diagram illustrating an exemplary CSB reading operation of reading a soft bit (i.e., a soft information value) from a memory cell of the flash memory.

Please refer to FIG. 6, which is a diagram illustrating an exemplary CSB reading operation of reading a soft bit (i.e., a soft information value) from a memory cell of the flash memory 102. In accordance with the exemplary threshold voltage distributions shown in FIG. 2 and FIG. 3, a memory cell with any of the electrical charge levels L0, L1, L6, and L7 would store CSB=1, and a memory cell with any of the electrical charge levels L2-L5 would store CSB=0. In this exemplary embodiment, the control unit 112 determines two initial control gate voltages $V_{CSB1}$, $V_{CSB2}$ and a voltage spacing D, and then controls the flash memory 102 to perform seven read operations upon each of the memory cells M_0-M_K. Based on the voltage adjusting order OD1, the flash memory 102 sets the control gate voltage VG_0 by $V_{CSB1}$, $V_{CSB1}$+D, $V_{CSB1}$−D, $V_{CSB1}$+2D, $V_{CSB1}$−2D, $V_{CSB1}$+3D, and $V_{CSB1}$−3D, sequentially. Besides, based on the voltage adjusting order OD2 that is different from the voltage adjusting order OD1, the flash memory 102 sets the control gate voltage VG_0 by $V_{CSB2}$, $V_{CSB2}$−D, $V_{CSB2}$+D, $V_{CSB2}$−2D, $V_{CSB2}$+2D, $V_{CSB2}$−3D, and $V_{CSB2}$+3D, sequentially. Specifically, the flash memory 102 utilizes two control gate voltages $V_{CSB1}$ and $V_{CSB2}$ to determine the first binary digit of the bit sequence, utilizes two control gate voltages $V_{CSB1}$+D and $V_{CSB2}$−D to determine the second binary digit of the bit sequence, utilizes two control gate voltages $V_{CSB1}$−D and $V_{CSB2}$+D to determine the third binary digit of the bit sequence, utilizes two control gate voltages $V_{CSB1}$+2D and $V_{CSB2}$−2D to determine the fourth binary digit of the bit sequence, utilizes two control gate voltages $V_{CSB1}$−2D and $V_{CSB2}$+2D to determine the fifth binary digit of the bit sequence, utilizes two control gate voltages $V_{CSB1}$+3D and $V_{CSB2}$−3D to determine the sixth binary digit of the bit sequence, and utilizes two control gate voltages $V_{CSB1}$−3D and $V_{CSB2}$+3D to determine the seventh binary digit of the bit sequence. Please note that the voltage spacing D may be adjustable, and the voltage spacing used for adjusting the control gate voltage $V_{CSB1}$ in the voltage adjusting order OD1 may be different from the voltage spacing used for adjusting the control gate voltage $V_{CSB2}$ in the voltage adjusting order OD2.

As mentioned above, the flash memory 102 is capable of determining a hard bit value (i.e., CSB) of each of the memory cells M_0-M_K by the initial control gate voltages $V_{CSB1}$ and $V_{CSB2}$. Therefore, each of the bit sequences BS_0-BS_M has seven binary digits obtained due to the control gate voltages $V_{CSB1}$, $V_{CSB1}$+D, $V_{CSB1}$+D, $V_{CSB1}$+2D, $V_{CSB1}$−2D, $V_{CSB1}$+3D, $V_{CSB1}$−3D, $V_{CSB2}$, $V_{CSB2}$−D, $V_{CSB2}$+D, $V_{CSB2}$−2D, $V_{CSB2}$+2D, $V_{CSB2}$−3D, and $V_{CSB2}$+3D. Please note that each of the bit sequences BS_0-BS_M acts as a soft bit representative of the soft information read from a memory cell, and the binary digit obtained due to the initial control gate voltage $V_{CSB1}$ or $V_{CSB2}$ may serve as a sign bit (i.e., a hard bit value).

Similarly, each bit sequence may have one of eight possible binary digit combinations BS1-BS8. When the electrical charge currently stored on the floating gate of the memory cell makes the threshold voltage of the memory cell higher than $V_{CSB2}$+3D or lower than $V_{CSB1}$−3D, the bit sequence read from the memory cell would have the binary digit combination BS1="1111111". When the electrical charge currently stored on the floating gate of the memory cell makes the threshold voltage of the memory cell located between $V_{CSB2}$+2D and $V_{CSB2}$+3D or located between $V_{CSB1}$−2D and $V_{CSB1}$−3D, the bit sequence read from the memory cell would have the binary digit combination BS2="1111110". When the electrical charge currently stored on the floating gate of the memory cell makes the threshold voltage of the memory cell located between $V_{CSB2}$+D and $V_{CSB2}$+2D or located between $V_{CSB1}$−D and $V_{CSB1}$−2D, the bit sequence read from the memory cell would have the binary digit combination BS3="1111010". When the electrical charge currently stored on the floating gate of the memory cell makes the threshold voltage of the memory cell located between $V_{CSB2}$ and $V_{CSB2}$+D or located between $V_{CSB1}$ and $V_{CSB1}$−D, the bit sequence read from the memory cell would have the binary digit combination BS4="1101010". When the electrical charge currently stored on the floating gate of the memory cell makes the threshold voltage of the memory cell located between $V_{CSB2}$−3D and $V_{CSB1}$+3D, the bit sequence read from the memory cell would have the binary digit combination BS8="0000000". When the electrical charge currently stored on the floating gate of the memory cell makes the threshold voltage of the memory cell located between $V_{CSB2}$−2D and $V_{CSB2}$−3D or located between $V_{CSB1}$+2D and $V_{CSB1}$+3D, the bit sequence read from the memory cell would have the binary digit combination BS7="0000010". When the electrical charge currently stored on the floating gate of the memory cell makes the threshold voltage of the memory cell located between $V_{CSB2}$−D and $V_{CSB2}$−2D or located between $V_{CSB1}$+D and $V_{CSB1}$+2D, the bit sequence read from the memory cell would have the binary digit combination BS6="0001010". When the electrical charge currently stored on the floating gate of the memory cell makes the threshold voltage of the memory cell located between $V_{CSB2}$ and $V_{CSB2}$−D or located between $V_{CSB1}$ and $V_{CSB1}$+D, the bit sequence read from the memory cell would have the binary digit combination BS5="0101010".

When all of the binary digits included in a bit sequence are 1's, this means that the corresponding memory cell has the electrical charge level L0, L1, L6, or L7, and the reliability of CSB=1 may be high. When all of the binary digits included in a bit sequence are 0's, this means that the corresponding memory cell has the electrical charge level L2, L3, L4, or L5, and the reliability of CSB=0 may be high. However, when a bit sequence have different binary digits "0" and "1" included therein, this means that the corresponding memory cell has the electrical charge level L1, L2, L5, or L6. As the threshold voltage of the corresponding memory cell is located between $V_{CSB1}$−3D and $V_{CSB1}$+3D or located between $V_{CSB2}$−3D and $V_{CSB2}$+3D, the reliability of CSB=1/CSB=0 may be low due to the fact that the error probability may be high. Therefore, the bit sequences each having one of the binary digit combinations BS2-BS7 should be monitored to track the threshold voltage distribution variation around the initial control gate voltages $V_{CSB1}$ and $V_{CSB2}$ (i.e., the threshold voltage distribution variation between the electrical charge levels L1 and L2, and the threshold voltage distribution variation between the electrical charge levels L5 and L6).

The identifying unit 116 identifies specific bit sequences each having different binary digits "0" and "1" included therein. However, as the flash memory 102 simply outputs one bit sequence of a memory cell in response to seven read operations each utilizing two control gate voltages, the memory controller 104 does not know whether the bit sequence is generated from a memory cell having a threshold voltage between $V_{CSB1}$+3D and $V_{CSB1}$−3D or generated from a memory cell having a threshold voltage between $V_{CSB2}$+3D and $V_{CSB2}$−3D. For example, when the bit sequence BS_0 has the binary digit combination BS2 (i.e., "1111110"), the memory cell M_0 may have a threshold voltage located between $V_{CSB2}$+2D and $V_{CSB2}$+3D or located between $V_{CSB1}$−2D and $V_{CSB1}$−3D. Thus, to use the aforementioned threshold voltage distribution tracking mechanism employed for updating the specific bit sequences each having different binary digits "0" and "1" included therein, it is necessary to discriminate between a specific bit sequence generated from a memory cell having a threshold voltage located between $V_{CSB1}$−3D and $V_{CSB1}$+3D and a specific bit sequence generated from a memory cell having a threshold voltage located between $V_{CSB2}$−3D and $V_{CSB2}$+3D.

In one exemplary design, the identifying unit 116 identifies each specific bit sequence of a specific memory cell by further referring to identified bit (s) of the specific memory cell. For example, reading the LSB data of the memory cells M_0-M_K is performed prior to reading the CSB data of the memory cells M_0-M_K. Therefore, before the control unit 112 controls the flash memory 102 to output soft bits (i.e., soft information values) of the CSB data, the LSB bits of the memory cells M_0-M_K are known in advance. When finding a specific bit sequence with different binary digits included therein, the identifying unit 116 refers to an LSB bit of the specific memory cell which outputs the specific bit sequence to thereby identify whether the specific bit sequence is generated from the specific memory cell having a threshold voltage located between $V_{CSB1}$–3D and $V_{CSB1}$+3D or generated from the specific memory cell having a threshold voltage located between $V_{CSB2}$–3D and $V_{CSB2}$+3D.

As mentioned above, the determining unit 114 is arranged for determining an updated bit sequence of the at least one specific memory cell according to at least the specific bit sequence. By way of example, the determining unit 114 determines the updated bit sequence of the at least one specific memory cell by mapping the specific bit sequence to the updated bit sequence. In this exemplary design, the bit sequences BS_0-BS_K generated from the physical page P_0 are buffered in the storage device 108. When the ECC corrector 122 indicates that the bit sequences BS_0-BS_K include uncorrectable error bits, the identifying unit 116 is operative to monitor the bit sequences BS_0-BS_K and identify specific bit sequences each having different binary digits "0" and "1" included therein (i.e., specific bit sequences each having the binary digit combination BS2, BS3, BS4, BS5, BS6, or BS7). Specifically, with the help of identified bits (e.g., LSBs) of the memory cells M_0-M_K, the identifying unit 116 is capable of distinguish between specific bit sequences generated from specific memory cells each having a threshold voltage located between $V_{CSB1}$–3D and $V_{CSB1}$+3D and specific bit sequences generated from specific memory cells each having a threshold voltage located between $V_{CSB2}$–3D and $V_{CSB2}$+3D.

Next, the determining unit 114 determines a first mapping rule according to a first histogram derived from counting the specific bit sequences that are generated from identified specific memory cells each having a threshold voltage located between $V_{CSB1}$–3D and $V_{CSB1}$+3D, and also determines a second mapping rule according to a second histogram derived from counting identified specific bit sequences that are generated from specific memory cells each having a threshold voltage located between $V_{CSB2}$–3D and $V_{CSB2}$+3D. In addition, based on the first histogram, a new initial control gate voltage corresponding to a local minimum of the threshold voltage distribution corresponding to the electrical charge levels L1 and L2 can be found. Similarly, based on the second histogram, a new initial control gate voltage corresponding to a local minimum of the threshold voltage distribution corresponding to the electrical charge levels L5 and L6 can be found. After determining the first mapping rule, the determining unit 114 updates the specific bit sequences that are generated from identified specific memory cells each having a threshold voltage located between $V_{CSB1}$–3D and $V_{CSB1}$+3D. Similarly, after determining the second mapping rule, the determining unit 114 updates the specific bit sequences that are generated from identified specific memory cells each having a threshold voltage located between $V_{CSB2}$–3D and $V_{CSB2}$+3D. In this way, the error probability of the specific bit sequence is effectively lowered due to the adjustment made to the original binary digit combination. As a person skilled in the art can readily understand details directed to determining the first and second mapping rules and updating the specific bit sequences by the first and second mapping rules after reading above paragraphs pertinent to the example shown FIG. 5, further description is omitted here for brevity.

Next, the bit sequences BS_0-BS_K with one or more bit sequences updated/adjusted by the determining unit 114 according to the first and second mapping rules are processed by the ECC circuit (e.g., an LDPC decoder) 110 again. As the number of error bits can be reduced by the determining unit 114 collaborating with the identifying unit 116, the ECC circuit 110 may have chance to successfully correct any error bits remaining in the currently processed readout information (i.e., soft information) of the physical page P_0. When the ECC corrector 122 indicates that the decoded result generated from the ECC circuit 110 is error-free, the read operation of reading CSB data of the memory cells M_0-M_K of the target physical page P_0 is accomplished. On the other hand, when the ECC corrector 122 indicates that the currently processed readout information still contains uncorrectable error bits, the determining unit 116 may further adjust the first and second mapping rules to try reducing the error probability of the specific bit sequence identified by the identifying unit 116.

In above exemplary embodiment, the determining unit 114 performs the mapping operation to update the specific bit sequences identified by the identifying unit 116. However, this is for illustrative purposes only, and is not meant to be a limitation of the present invention. In an alternative design, after the determining unit 144 determines that other control gate voltages different from $V_{CSB1}$ and $V_{CSB2}$ should be better control gate voltages for identifying CSBs of the memory cells M_0-M_K, the control unit 106 may be configured to set the initial control gate voltages by voltage values found using the first histogram and the second histogram, and then control the flash memory 102 to perform seven read operations upon each of the memory cells M_0-M_K according to the updated initial control gate voltages. Therefore, the flash memory 102 outputs new bit sequences BS_0-BS_M. Next, the ECC circuit 110 processes the new bit sequences BS_0-BS_M (i.e., an updated codeword read from the physical page P_0) to correct any error bits found in the new bit sequences BS_0-BS_M. As a person skilled in the art can readily understand related operation after reading above paragraphs, further description is omitted here for brevity.

Briefly summarized, in a case where each read operation utilizes more than one control gate voltage (e.g., two control gate voltages) applied to a control gate of each of the memory cells, and control gate voltages utilized by one read operation is different from control gate voltages utilized by another read operation, the identifying unit 116 is implemented for identifying any specific bit sequence having different binary digits included therein according to each identified bit of the specific memory cell which outputs the specific bit sequence, and the determining unit 114 is implemented for determining updated specific bit sequences according to the specific bit sequences identified by the identifying unit 116. In one exemplary design, the determining unit 114 determines the updated bit sequences by performing a mapping operation upon the specific bit sequences. In another exemplary design, the determining unit 114 determines new initial control gate voltages, and the control unit 112 refers to the new initial control gate voltages to control the flash memory 102 to output bit sequences having updated specific bit sequence (s) included therein.

Figure 7:
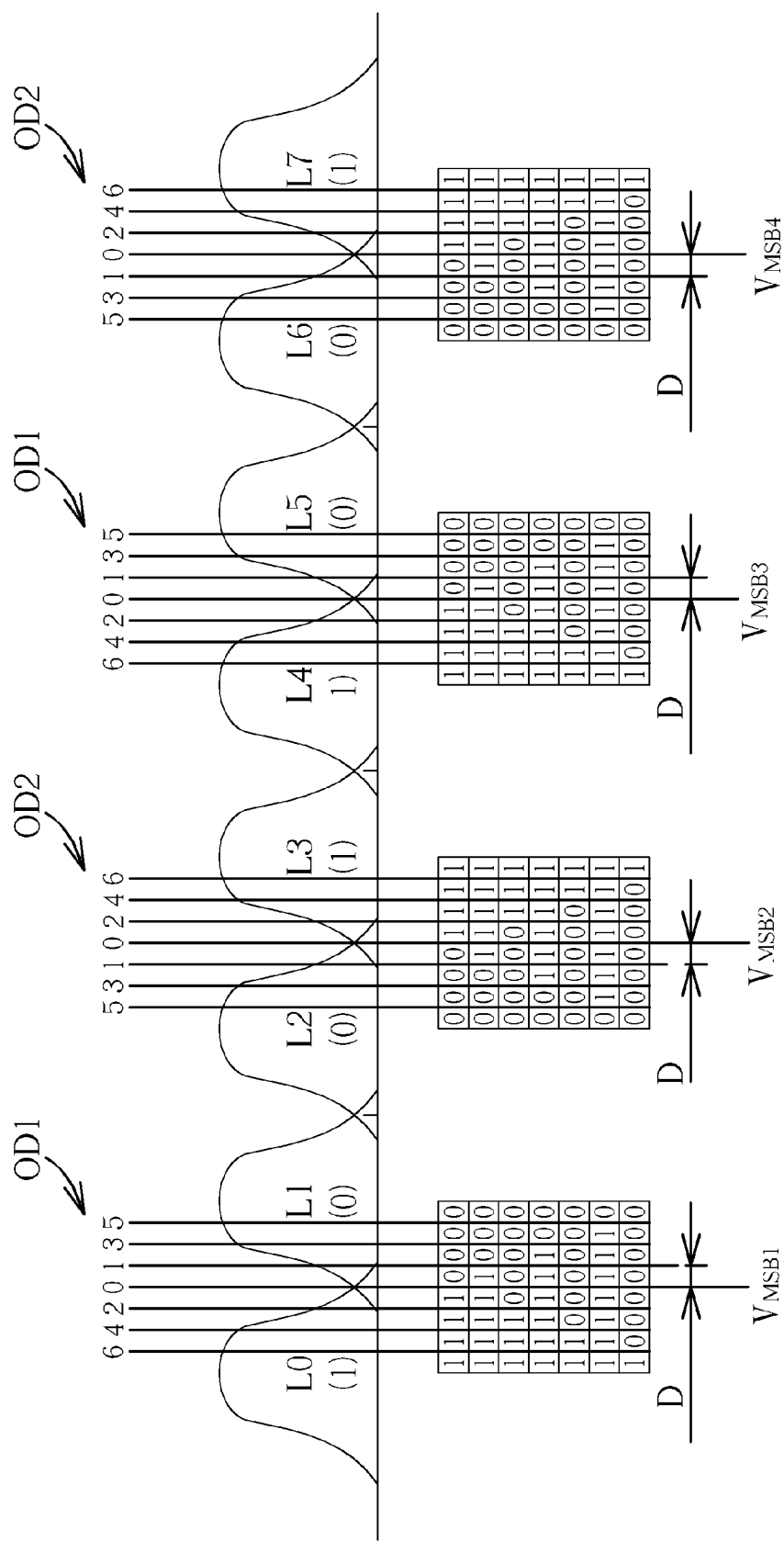
FIG. 7 is a diagram illustrating an exemplary MSB reading operation of reading a soft bit (i.e., a soft information value) from a memory cell of the flash memory.

Please refer to FIG. 7, which is a diagram illustrating an exemplary MSB reading operation of reading a soft bit (i.e., a soft information value) from a memory cell of the flash memory 102. In accordance with the exemplary threshold voltage distributions shown in FIG. 2 and FIG. 3, a memory cell with any of the electrical charge levels L0, L3, L4, and L7 would store MSB=1, and a memory cell with any of the electrical charge levels L1, L2, L5, and L6 would store MSB=0. In this example, the control unit 112 determines four initial control gate voltages $V_{MSB1}$, $V_{MSB2}$, $V_{MSB3}$, $V_{MSB4}$ and a voltage spacing D, and then controls the flash memory 102 to perform seven read operations upon each of the memory cells M_0-M_K. Based on the voltage adjusting order OD1, the flash memory 102 sets the control gate voltage VG_0 by $V_{MSB1}$, $V_{MSB1}$+D, $V_{MSB1}$−D, $V_{MSB1}$+2D, $V_{MSB1}$−2D, $V_{MSB1}$+3D, and $V_{MSB1}$−3D, sequentially, and further sets the control gate voltage VG_0 by $V_{MSB3}$, $V_{MSB3}$+D, $V_{MSB3}$−D, $V_{MSB3}$+2D, $V_{MSB3}$−2D, $V_{MSB3}$+3D, and $V_{MSB3}$−3D, sequentially. Besides, based on the voltage adjusting order OD2 that is different from the voltage adjusting order OD1, the flash memory 102 also sets the control gate voltage VG_0 by $V_{MSB2}$, $V_{MSB2}$−D, $V_{MSB2}$+D, $V_{MSB2}$−2D, $V_{MSB2}$+2D, $V_{MSB2}$−3D, and $V_{MSB2}$+3D, sequentially, and further sets the control gate voltage VG_0 by $V_{MSB4}$, $V_{MSB4}$−D, $V_{MSB4}$+D, $V_{MSB4}$−2D, $V_{MSB4}$+2D, $V_{MSB4}$−3D, and $V_{MSB4}$+3D, sequentially. Specifically, the flash memory 102 determines the first binary digit of the bit sequence by four control gate voltages $V_{MSB1}$, $V_{MSB2}$, $V_{MSB3}$, and $V_{MSB4}$, determines the second binary digit of the bit sequence by four control gate voltages $V_{MSB1}$+D, $V_{MSB2}$−D, $V_{MSB3}$+D, and $V_{MSB4}$−D, determines the third binary digit of the bit sequence by four control gate voltages $V_{MSB1}$−D, $V_{MSB2}$+D, $V_{MSB3}$−D, and $V_{MSB4}$+D, determines the fourth binary digit of the bit sequence by four control gate voltages $V_{MSB1}$+2D, $V_{MSB2}$−2D, $V_{MSB3}$+2D, and $V_{MSB4}$−2D, determines the fifth binary digit of the bit sequence by four control gate voltages $V_{MSB1}$−2D, $V_{MSB2}$+2D, $V_{MSB3}$−2D, and $V_{MSB4}$+2D, determines the sixth binary digit of the bit sequence by four control gate voltages $V_{MSB1}$+3D, $V_{MSB2}$−3D, $V_{MSB3}$+3D, and $V_{MSB4}$−3D, and determines the seventh binary digit of the bit sequence by four control gate voltages $V_{MSB1}$−3D, $V_{MSB2}$+3D, $V_{MSB3}$−3D, and $V_{MSB4}$+3D. Please note that the voltage spacing D may be adjustable, and the voltage spacing values used for adjusting the control gate voltages $V_{MSB1}$-$V_{MSB4}$ may be different from one another.

As mentioned above, the flash memory 102 is capable of determining a hard bit value (i.e., MSB) of each of the memory cells M_0-M_K by the initial control gate voltages $V_{MSB1}$, $V_{MSB2}$, $V_{MSB3}$, and $V_{MSB4}$. Therefore, each of the bit sequences BS_0-BS_M has seven binary digits obtained due to the above-mentioned voltages. Please note that each of the bit sequences BS_0-BS_M acts as a soft bit representative of the soft information read from a memory cell, and the binary digit obtained due to the initial control gate voltage $V_{MSB1}$, $V_{MSB2}$, $V_{MSB3}$, or $V_{MSB4}$ may serve as a sign bit (i.e., a hard bit value).

Similarly, each bit sequence may have one of eight possible binary digit combinations BS1-BS8. When the electrical charge currently stored on the floating gate of the memory cell makes the threshold voltage of the memory cell higher than $V_{MSB4}$+3D, lower than $V_{MSB1}$−3D, or located between $V_{MSB2}$+3D and $V_{MSB3}$−3D, the bit sequence read from the memory cell would have the binary digit combination BS1="1111111". When the electrical charge currently stored on the floating gate of the memory cell makes the threshold voltage of the memory cell located between $V_{MSB4}$+2D and $V_{MSB2}$+3D, located between $V_{MSB1}$−2D and $V_{MSB1}$−3D, located between $V_{MSB3}$−2D and $V_{MSB3}$−3D, or located between $V_{MSB2}$+2D and $V_{MSB2}$+3D, the bit sequence read from the memory cell would have the binary digit combination BS2="1111110". When the electrical charge currently stored on the floating gate of the memory cell makes the threshold voltage of the memory cell located between $V_{MSB4}$+D and $V_{MSB4}$+2D, located between $V_{MSB2}$+D and $V_{MSB2}$+2D, located between $V_{MSB1}$−D and $V_{MSB1}$−2D, or located between $V_{MSB3}$−D and $V_{MSB3}$−2D, the bit sequence read from the memory cell would have the binary digit combination BS3="1111010". When the electrical charge currently stored on the floating gate of the memory cell makes the threshold voltage of the memory cell located between $V_{MSB4}$ and $V_{MSB4}$+D, located between $V_{MSB2}$ and $V_{MSB2}$+D, located between $V_{MSB1}$ and $V_{MSB1}$−D, or located from the between $V_{MSB3}$ and $V_{MSB3}$−D, the bit sequence read from the memory cell would have the binary digit combination BS4="1101010". When the electrical charge currently stored on the floating gate of the memory cell makes the threshold voltage of the memory cell located between $V_{MSB4}$−3D and $V_{MSB3}$+3D or located between $V_{MSB2}$−3D and $V_{MSB1}$+3D, the bit sequence read from the memory cell would have the binary digit combination BS8="0000000". When the electrical charge currently stored on the floating gate of the memory cell makes the threshold voltage of the memory cell located between $V_{MSB4}$−2D and $V_{MSB4}$−3D, located between $V_{MSB2}$−2D and $V_{MSB2}$−3D, located between $V_{MSB1}$+2D and $V_{MSB1}$+3D, or located between $V_{MSB3}$+2D and $V_{MSB3}$+3D, the bit sequence read from the memory cell would have the binary digit combination BS7="0000010". When the electrical charge currently stored on the floating gate of the memory cell makes the threshold voltage of the memory cell located between $V_{MSB4}$−D and $V_{MSB4}$−2D, located between $V_{MSB2}$−D and $V_{MSB2}$−2D, located between $V_{MSB1}$+D and $V_{MSB1}$+2D, or located between $V_{MSB3}$+D and $V_{MSB3}$+2D, the bit sequence read from the memory cell would have the binary digit combination BS6="0001010". When the electrical charge currently stored on the floating gate of the memory cell makes the threshold voltage of the memory cell located between $V_{MSB4}$ and $V_{MSB4}$−D, located between $V_{MSB2}$ and $V_{MSB2}$−D, located between $V_{MSB1}$ and $V_{MSB1}$+D, or located between $V_{MSB3}$ and $V_{MSB3}$+D, the bit sequence read from the memory cell would have the binary digit combination BS5="0101010".

When all of the binary digits included in a bit sequence are 1's, this means that the corresponding memory cell has the electrical charge level L0, L3, L4, or L7, and the reliability of MSB=1 may be high. When all of the binary digits included in a bit sequence are 0's, this means that the corresponding memory cell has the electrical charge level L1, L2, L5, or L6, and the reliability of MSB=0 may be high. However, when a bit sequence have different binary digits "0" and "1" included therein, this means that the corresponding memory cell has the electrical charge level being one of L0-L7. As the threshold voltage of the corresponding memory cell is located between $V_{MSB1}$−3D and $V_{MSB1}$+3D, located between $V_{MSB2}$−3D and $V_{MSB2}$+3D, located between $V_{MSB3}$−3D and $V_{MSB3}$+3D, or located between $V_{MSB4}$−3D and $V_{MSB4}$+3D, the reliability of MSB=1/MSB=0 may be low due to the fact that the error probability may be high. Therefore, the bit sequences each having one of the binary digit combinations BS2-BS7 should be monitored to track the threshold voltage distribution variation around the initial control gate voltages $V_{MSB1}$-$V_{MSB4}$ (i.e., the threshold voltage distribution variation between the electrical charge levels L0 and L1, the threshold voltage distribution variation between the electrical charge levels L2 and L3, the threshold voltage distribution variation between the electrical charge levels L4 and L5, and the threshold voltage distribution variation between the electrical charge levels L6 and L7).

Similarly, as the flash memory 102 simply outputs one bit sequence of a memory cell in response to seven read operations each utilizing four control gate voltages, it is necessary to discriminate among a specific bit sequence generated from a memory cell having a threshold voltage located between $V_{MSB1}$−3D and $V_{MSB1}$+3D, a specific bit sequence generated from a memory cell having a threshold voltage located between $V_{MSB2}$−3D and $V_{MSB2}$+3D, a specific bit sequence generated from a memory cell having a threshold voltage located between $V_{MSB3}$−3D and $V_{MSB3}$+3D, and a specific bit sequence generated from a memory cell having a threshold voltage located between $V_{MSB4}$−3D and $V_{MSB4}$+3D. In one exemplary design, the identifying unit 116 identifies each specific bit sequence of a specific memory cell by further referring to identified bit(s) of the specific memory cell. For example, reading the LSB data and CSB data of the memory cells M_0-M_K is performed prior to reading the MSB data of the memory cells M_0-M_K. Therefore, before the control unit 112 controls the flash memory 102 to output soft bits (i.e., soft information values) of the MSB data, the LSBs and CSBs of the memory cells M_0-M_K are known in advance and therefore can be utilized by the identifying unit 116 to identify whether the specific bit sequence is generated from the specific memory cell having a threshold voltage located between $V_{MSB1}$−3D and $V_{MSB1}$+3D, generated from the specific memory cell having a threshold voltage located between $V_{MSB2}$−3D and $V_{MSB2}$+3D, generated from the specific memory cell having a threshold voltage located between $V_{MSB3}$−3D and $V_{MSB3}$+3D, or generated from the specific memory cell having a threshold voltage located between $V_{MSB4}$−3D and $V_{MSB4}$+3D.

As mentioned above, the determining unit 114 is arranged for determining an updated bit sequence of the at least one specific memory cell according to at least the specific bit sequence. By way of example, the determining unit 114 determines the updated bit sequence of the at least one specific memory cell by mapping the specific bit sequence to the updated bit sequence. In this exemplary design, the bit sequences BS_0-BS_K generated from the physical page P_0 are buffered in the storage device 108. When the ECC corrector 122 indicates that the bit sequences BS_0-BS_K include uncorrectable error bits, the identifying unit 116 is operative to monitor the bit sequences BS_0-BS_K and identify specific bit sequences each having different binary digits "0" and "1" included therein (i.e., specific bit sequences each having the binary digit combination BS2, BS3, BS4, BS5, BS6, or BS7). Specifically, with the help of identified bits (e.g., LSBs and CSBs) of the memory cells M_0-M_K, the identifying unit 116 is capable of identifying specific bit sequences generated from specific memory cells each having a threshold voltage located between $V_{MSB1}$−3D and $V_{MSB1}$+3D, identifying specific bit sequences generated from specific memory cells each having a threshold voltage located between $V_{MSB2}$−3D and $V_{MSB2}$+3D, identifying specific bit sequences generated from specific memory cells each having a threshold voltage located between $V_{MSB3}$−3D and $V_{MSB3}$+3D, and identifying specific bit sequences generated from specific memory cells each having a threshold voltage located between $V_{MSB4}$−3D and $V_{MSB4}$+3D.

Next, the determining unit 114 determines a first mapping rule according to a first histogram derived from counting the specific bit sequences that are generated from identified specific memory cells each having a threshold voltage located between $V_{MSB1}$−3D and $V_{MSB1}$+3D, determines a second mapping rule according to a second histogram derived from counting identified specific bit sequences that are generated from specific memory cells each having a threshold voltage located between $V_{MSB2}$−3D and $V_{MSB2}$+3D, determines a third mapping rule according to a third histogram derived from counting identified specific bit sequences that are generated from specific memory cells each having a threshold voltage located between $V_{MSB3}$−3D and $V_{MSB3}$+3D, and determines a fourth mapping rule according to a fourth histogram derived from counting identified specific bit sequences that are generated from specific memory cells each having a threshold voltage located between $V_{MSB4}$−3D and $V_{MSB4}$+3D.

As a person skilled in the art can readily understand details of reading MSB data from the memory cells after reading above paragraphs illustrating details of reading CSB data from the memory cells, further description is omitted here for brevity.

Briefly summarized, in a case where each read operation utilizes more than one control gate voltage (e.g., four control gate voltages) applied to a control gate of each of the memory cells, and control gate voltages utilized by one read operation is different from control gate voltages utilized by another read operation, the identifying unit 116 is implemented for identifying any specific bit sequence having different binary digits included therein according to each identified bit of the specific memory cell which outputs the specific bit sequence, and the determining unit 114 is implemented for determining updated specific bit sequences according to the specific bit sequences identified by the identifying unit 116. In one exemplary design, the determining unit 114 determines the updated bit sequences by performing a mapping operation upon the specific bit sequences. In another exemplary design, the determining unit 114 determines new initial control gate voltages, and the control unit 112 refers to the new initial control gate voltages to control the flash memory 102 to output bit sequences having updated specific bit sequence(s) included therein.

As mentioned above, when reading soft information of the CSB data stored in the memory cells, the LSBs of the memory cells are used by the identifying unit 116 to discriminate between specific bit sequences that are generated from memory cells each having a threshold voltage located between $V_{CSB1}$−3D and $V_{CSB1}$+3D and specific bit sequences that are generated from memory cells each having a threshold voltage located between $V_{CSB2}$−3D and $V_{CSB2}$+3D. Thus, the step of reading the soft information of the LSB data is required to be performed before the step of reading the soft information of the CSB data. However, in an alternative design, the identifying unit 116 is capable of discriminating between specific bit sequences without referring to the identified bits (e.g., LSBs) of the memory cells. Please refer to FIG. 8, which is a diagram illustrating another exemplary CSB reading operation of reading a soft bit (i.e., a soft information value) from a memory cell of the flash memory 102. In accordance with the exemplary threshold voltage distributions shown in FIG. 2 and FIG. 3, a memory cell with any of the electrical charge levels L0, L1, L6, and L7 would store CSB=1, and a memory cell with any of the electrical charge levels L2-L5 would store CSB=0. In this exemplary embodiment, the control unit 112 determines two initial control gate voltages $V_{CSB1}$, $V_{CSB2}$ and a voltage spacing D. As shown in sub-diagram (A) of FIG. 8, the control unit 112 controls the flash memory 102 to perform seven first read operations upon each of the memory cells M_0-M_K, wherein the flash memory 102 sets the control gate voltage VG_0 by $V_{CSB1}$, $V_{CSB1}$+D, $V_{CSB1}$−D, $V_{CSB1}$+2D, $V_{CSB1}$−2D, $V_{CSB1}$+3D, and $V_{CSB1}$−3D in the voltage adjusting order OD1 and sets the control gate voltage VG_0 by $V_{CSB2}$, $V_{CSB2}$−D, $V_{CSB2}$+D, $V_{CSB2}$−2D, $V_{CSB2}$+2D, $V_{CSB2}$−3D, and $V_{CSB2}$+3D in the voltage adjusting order OD2 which is different from the voltage adjusting order OD1. In a case where the electrical charge stored on a floating gate of a memory cell makes the memory cell store a weak "1" due to a threshold voltage located between $V_{CSB1}$ and $V_{CSB1}-D$, the bit sequence read from the memory cell will have the binary digit combination BS4 (i.e., 1101010). In another case where the electrical charge stored on the floating gate of the memory cell makes the memory cell store a weak "1" due to the threshold voltage located between $V_{CSB2}$ and $V_{CSB2}+D$, the bit sequence read from the memory cell will have the same binary digit combination BS4 (i.e., 1101010).

Figure 8:
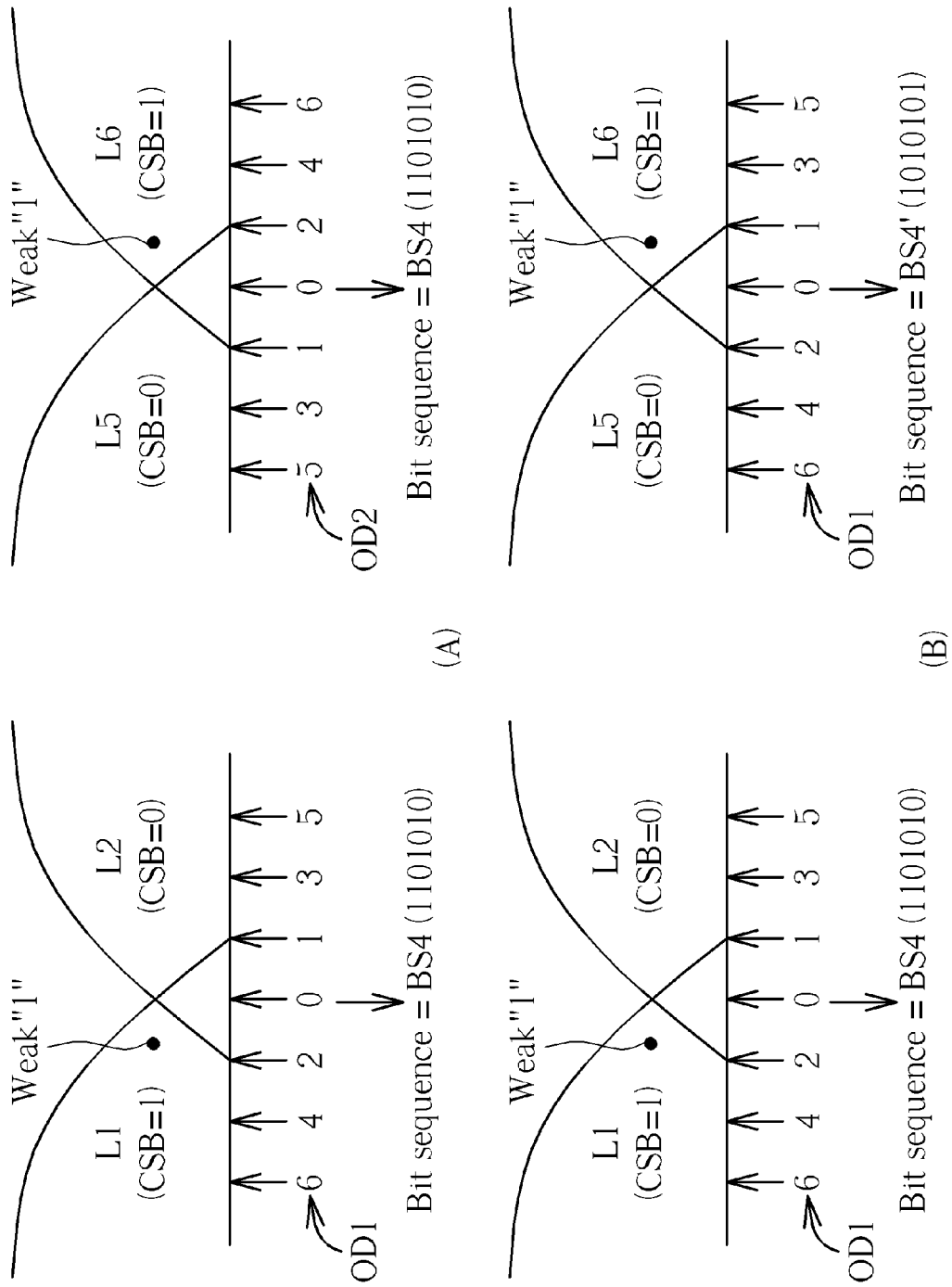
FIG. 8 is a diagram illustrating another exemplary CSB reading operation of reading a soft bit (i.e., a soft information value) from a memory cell of the flash memory.

As shown in sub-diagram (B) of FIG. 8, the control unit 112 may control the flash memory 102 to perform seven second read operations upon each of the memory cells M_0-M_K, wherein the flash memory 102 sets the control gate voltage VG_0 by $V_{CSB1}$, $V_{CSB1}+D$, $V_{CSB1}-D$, $V_{CSB1}+2D$, $V_{CSB1}-2D$, $V_{CSB1}+3D$, and $V_{CSB1}-3D$ in the voltage adjusting order OD1 and sets the control gate voltage VG_0 by $V_{CSB2}$, $V_{CSB2}+D$, $V_{CSB2}-D$, $V_{CSB2}+2D$, $V_{CSB2}-2D$, $V_{CSB2}+3D$, and $V_{CSB2}-3D$ in the same voltage adjusting order OD1. As to the case where the electrical charge stored on the floating gate of the memory cell makes the memory cell store a weak "1" due to the threshold voltage located between $V_{CSB1}$ and $V_{CSB1}-D$, the bit sequence read from the memory cell will have the binary digit combination BS4 (i.e., 1101010). However, as to another case where the electrical charge stored on the floating gate of the memory cell makes the memory cell store a weak "1" due to the threshold voltage located between $V_{CSB2}$ and $V_{CSB2}+D$, the bit sequence read from the memory cell will have a different binary digit combination BS4' (i.e., 1010101).

Therefore, when a first bit sequence generated from first read operations using control gate voltages set according to different voltage adjusting orders (e.g., OD1 and OD2) is identical to a second bit sequence generated from second read operations using control gate voltages set by the same voltage adjusting order (e.g., OD1), the identifying unit 116 knows that the first bit sequence/second bit sequence is generated from a memory cell having a threshold voltage located between $V_{CSB1}-3D$ and $V_{CSB1}+3D$. When the first bit sequence generated from first read operations using control gate voltages set according to different voltage adjusting orders (e.g., OD1 and OD2) is different from the second bit sequence generated from second read operations using control gate voltages set by the same voltage adjusting order (e.g., OD1), the identifying unit 116 knows that the first bit sequence/second bit sequence is generated from a memory cell having a threshold voltage located between $V_{CSB2}-3D$ and $V_{CSB2}+3D$.

To put it simply, the control unit 112 of the control logic 106 controls the flash memory 102 to perform a plurality of read operations upon each of the memory cells of one physical page for obtaining soft bits of the memory cells, wherein the read operations include first read operations and second read operations each utilizing two control gate voltages applied to a control gate of each memory cell. The two control gate voltages utilized by one of the first read operations are different from the two control gate voltages utilized by another of the first read operations, one of the two control gate voltages utilized in each of the first read operations is set according to a first voltage adjusting order, the other of the two control gate voltages utilized in each of the first read operations is set according to a second voltage adjusting order different from the first voltage adjusting order. Besides, the two control gate voltages utilized by one of the second read operations are different from the two control gate voltages utilized by another of the second read operations, one of the two control gate voltages utilized in each of the second read operations is set according to the first voltage adjusting order, and the other of the two control gate voltages utilized in each of the second read operations is set according to the first voltage adjusting order. The identifying unit 116 of the control logic 106 identifies a specific bit sequence with different binary digits included therein by referring to a first bit sequence read from a specific memory cell by the first read operations and a second bit sequence read from the specific memory cell by the second read operations. After the specific bit sequences, each having different binary digits included therein, are correctly categorized by the identifying unit 116, the determining unit 114 can employ the aforementioned procedure to determine the updated bit sequences correctly.

The read operations shown in sub-diagram (A) of FIG. 8 may be briefly summarized as below. For performing read operations requested by the voltage adjusting order OD1, the flash memory 102 initially utilizes $V_{CSB1}$ to read the memory cells M_0-M_K. After that, the flash memory 102 utilizes $V_{CSB1}+D$ to read the memory cells M_0-M_K for performing another read operation requested by the voltage adjusting order OD1. After that, the flash memory 102 utilizes $V_{CSB1}-D$ to read the memory cells M_0-M_K for performing yet another read operation requested by the voltage adjusting order OD1. In addition, for performing read operations requested by the voltage adjusting order OD2, the flash memory 102 initially utilizes $V_{CSB2}$ to read the memory cells M_0-M_K. After that, the flash memory 102 utilizes $V_{CSB2}-D$ to read the memory cells M_0-M_K for performing another read operation requested by the voltage adjusting order OD2. After that, the flash memory 102 utilizes $V_{CSB2}+D$ to read the memory cells M_0-M_K for performing yet another read operation requested by the voltage adjusting order OD2. Please note that the voltage adjusting order OD1 is different from the voltage adjusting order OD2; however, as clearly shown in the figure, both of the voltage adjusting orders OD1 and OD2 makes respective initial control gate voltages $V_{CSB1}$ and $V_{CSB2}$ first shifted toward CSB="0" (i.e., one adjacent electrical charge level representative of a specific bit with a first binary digit) and then further shifted toward CSB="1" (i.e., another adjacent electrical charge level representative of the specific bit with a second binary digit). In these two weak "1" cases, the memory controller 104 receives the same bit sequence (i.e., 1101010). Thus, the memory controller 104 can not distinguish these two different weak "1" cases from the received bit sequence.

The read operations shown in sub-diagram (B) of FIG. 8 may be briefly summarized as below. The shifting direction of the control gate voltage is slightly different from that mentioned above. For performing read operations requested by the voltage adjusting order OD1, the flash memory 102 initially utilizes $V_{CSB1}$ to read the memory cells M_0-M_K. After that, the flash memory 102 utilizes $V_{CSB1}+D$ to read the memory cells M_0-M_K for performing another read operation requested by the voltage adjusting order OD1. After that, the flash memory 102 utilizes $V_{CSB1}-D$ to read the memory cells M_0-M_K for performing yet another read operation requested by the voltage adjusting order OD1. In addition, for performing read operations requested by another voltage adjusting order OD1, the flash memory 102 initially utilizes $V_{CSB2}$ to read the memory cells M_0-M_K. After that, the flash memory 102 utilizes $V_{CSB2}+D$ to read the memory cells M_0-M_K for performing another read operation requested by the voltage adjusting order OD1. After that, the flash memory 102 utilizes $V_{CSB2}-D$ to read the memory cells M_0-M_K for performing yet another read operation requested by the voltage adjusting order OD1. Please note that the same voltage adjusting order OD1 is employed; however, as clearly shown in the figure, one voltage adjusting order OD1 makes an initial control gate voltage $V_{CSB1}$ first shifted toward CSB="0" (i.e., one adjacent electrical charge level representative of the specific bit with the first binary digit) and then further shifted toward CSB="1" (i.e., another adjacent electrical charge level representative of the specific bit with the second binary digit), and the other voltage adjusting order OD1 makes an initial control gate voltage $V_{CSB2}$ first shifted toward CSB="1" (i.e., one adjacent electrical charge level representative of the specific bit with the second binary digit) and then further shifted toward CSB="0" (i.e., another adjacent electrical charge level representative of the specific bit with the first binary digit). In these two weak "1" cases, the memory controller 104 receives different bit sequences (i.e., 1101010 and 1010101). Thus, with a proper setting of the voltage adjusting orders, the memory controller 104 can distinguish these two different weak "1" cases from the received bit sequences. Hence, the memory controller 104 is capable of distinguishing these two different weak "1" cases without needing other auxiliary information (e.g., LSB data).

Figure 9:
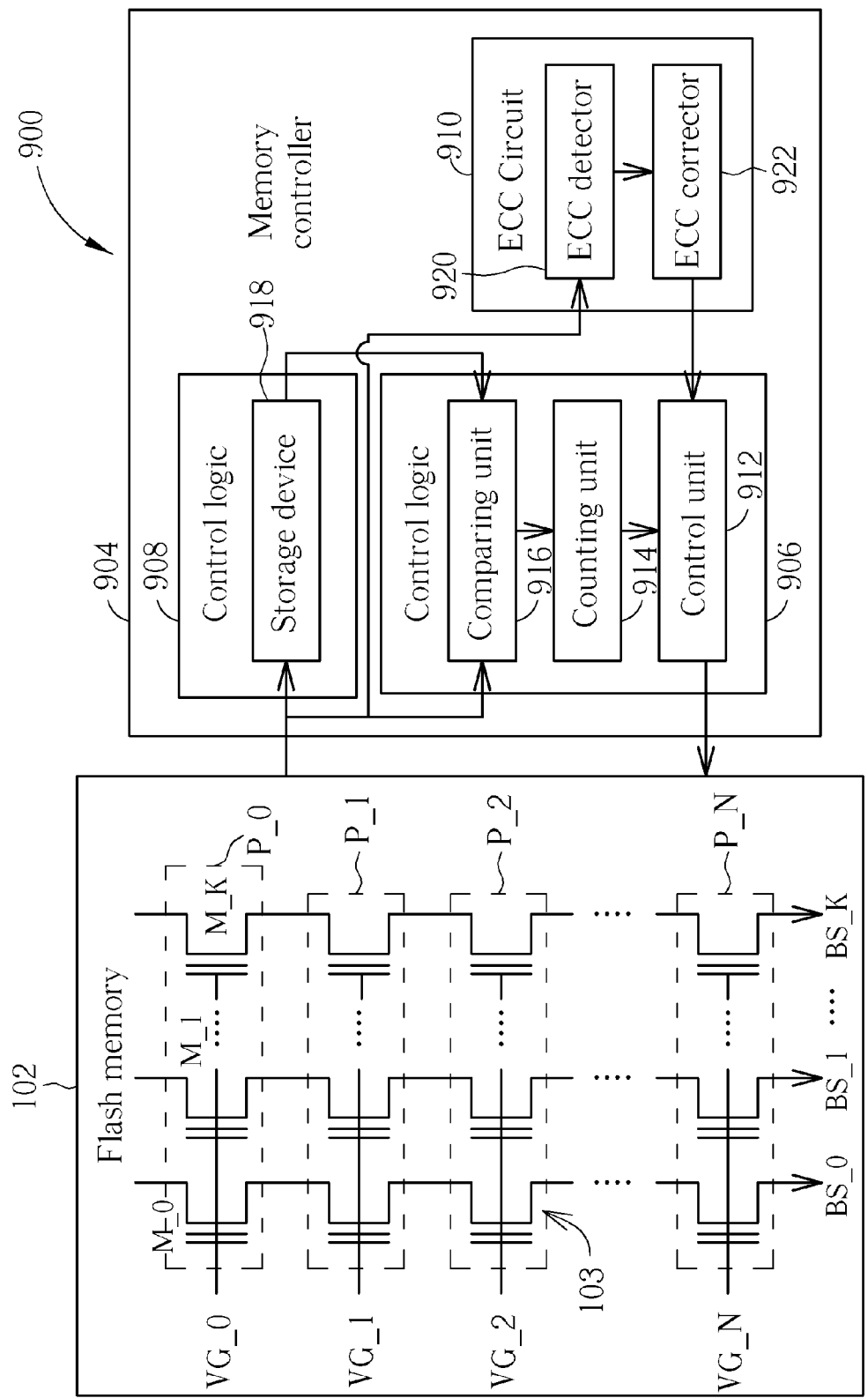
FIG. 9 is a diagram illustrating a memory system according to a second exemplary embodiment of the present invention.

Please refer to FIG. 9, which is a diagram illustrating a memory system according to a second exemplary embodiment of the present invention. The exemplary memory system 900 includes a memory controller 904 and the aforementioned flash memory (e.g., a NAND-type flash memory) 102. To read the data stored in the memory cells M_0-M_K of the target physical page P_0, the control gate voltages VG_0-VG_N should be properly set. Each of the memory cells 103 in this exemplary embodiment is configured to store 3 bits, including a least significant bit (LSB), a central significant bit (CSB), and a most significant bit (MSB). Thus, the memory controller 904 determines seven control gate voltages $V_{LSB}$, $V_{CSB1}$, $V_{CSB2}$, $V_{MSB1}$, $V_{MSB2}$, $V_{MSB3}$, and $V_{MSB4}$, and controls the flash memory 102 to perform read operations according to these configured control gate voltages. As the details of read operations performed in the flash memory 102 are already described above, further description is omitted here for brevity.

The memory controller 904 is implemented to control access (read/write) of the flash memory 102. In this exemplary embodiment, the memory controller 904 includes, but is not limited to, a control logic 906 having a control unit 912, a counting unit 914, and a comparing unit 916 included therein, a receiving circuit 908 having a storage device (e.g., a memory device) 918, and an ECC circuit 910 having an ECC detector 920 and an ECC corrector 922 included therein. Please note that only the elements pertinent to the technical features of the present invention are shown in FIG. 9 for clarity and simplicity. That is, the memory controller 904 may include additional elements to support other functionality. As mentioned above, the threshold voltage distribution of memory cells 103 included in the flash memory 102 may be changed due to certain factors such as read disturbance, write/program disturbance, and/or retention disturbance. As known to those skilled in the art, part of the memory cells 103 of one physical page is utilized for storing ECC information (e.g., an ECC code). Thus, the ECC circuit 910 is operative to perform an ECC operation upon the readout information (e.g., a codeword) read from one physical page. More specifically, the ECC detector 120 checks the correctness of the readout information, thereby detecting the existence of error bits presented in the checked readout information. When notified by the ECC detector 920, the ECC corrector 922 is operative for correcting the error bits found in the checked readout information. However, when the number of error bits existing in the readout information exceeds a maximum number of error bits that can be corrected by the ECC corrector 922, the ECC corrector 922 indicates that the readout information includes uncorrectable error bits. Thus, the control logic 906 enables the threshold voltage distribution tracking mechanism to determine the readout information which can pass the ECC parity check performed by the ECC circuit 910. Detailed are described as below.

In this exemplary embodiment, the ECC circuit 910 may be a Bose-Chaudhuri-Hocquenghem (BCH) decoder. The control logic 906 is arranged for controlling the flash memory 102 to perform a plurality of read operations upon each of the memory cells M_0-M_K of the target physical page P_0, and determining readout information of the memory cells M_0-M_K according to binary digit distribution characteristics of bit sequences BS_0-BS_K. The read operations include at least a first read operation, a second read operation, and a third read operation used for determining control gate voltage shifting direction (s) used for finding better control gate voltage (s). Further details are described as below.

Figure 10:
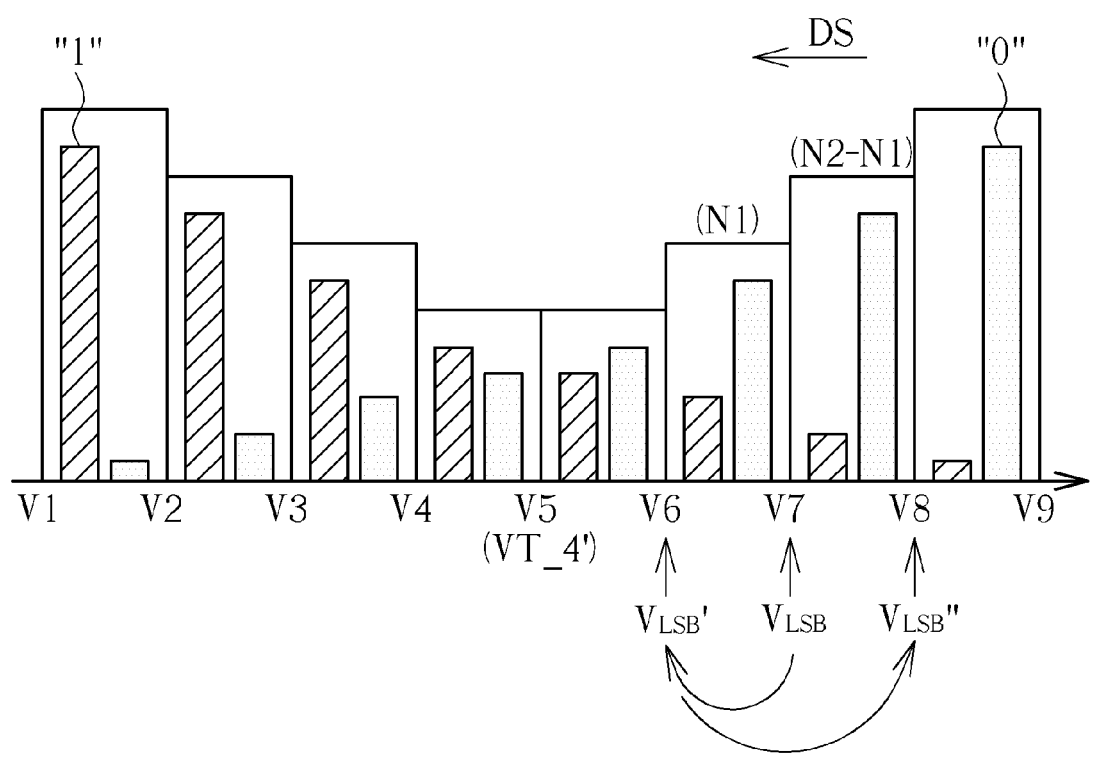
FIG. 10 is a diagram illustrating the adjustment made to the control gate voltage used for reading LSB data according to a first embodiment of the present invention.
Figure 11:
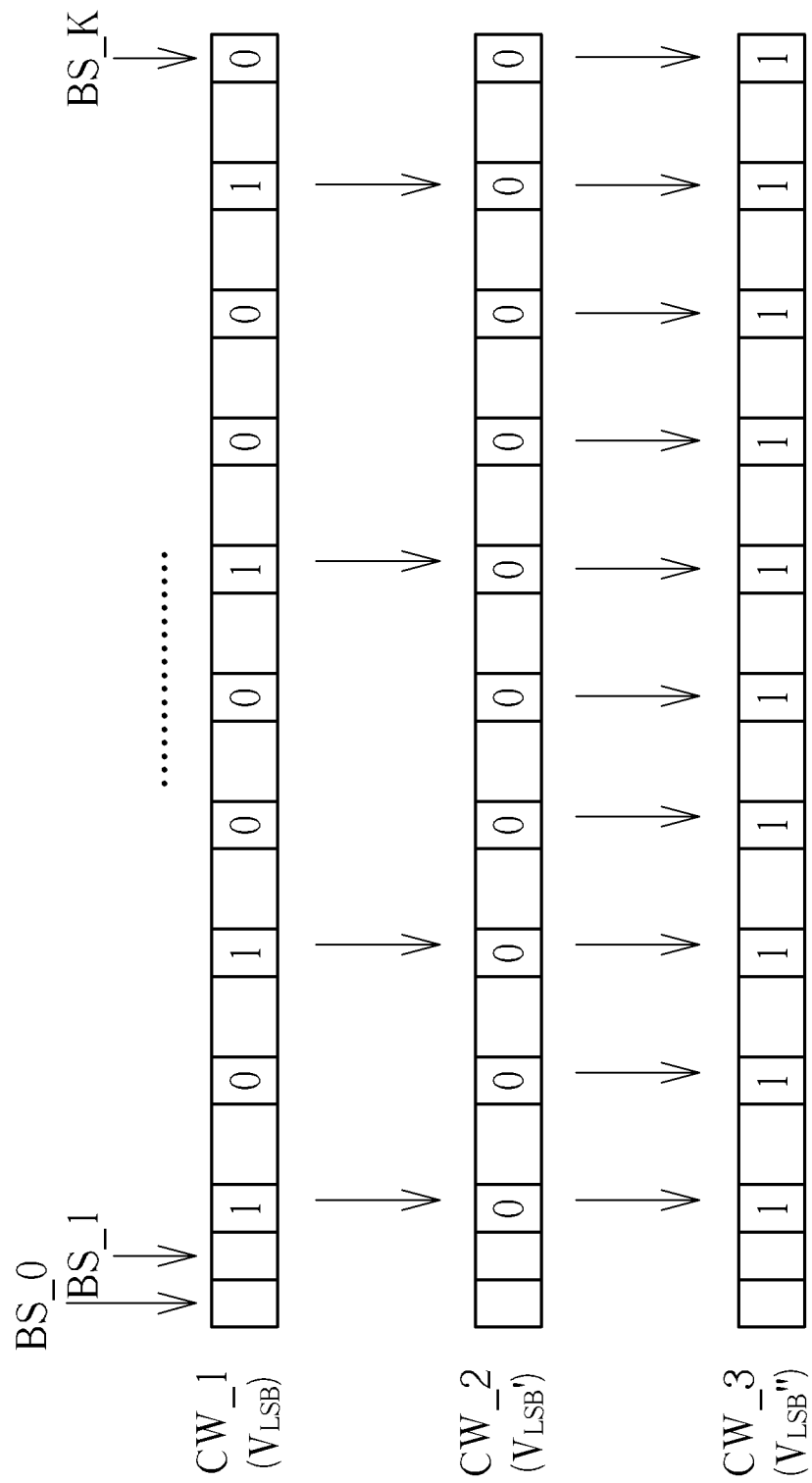
FIG. 11 is a diagram illustrating the operation of determining a shifting direction of the control gate voltage for finding a better control gate voltage used for reading LSB data according to a first embodiment of the present invention.

Please refer to FIG. 10 in conjunction with FIG. 11. FIG. 10 is a diagram illustrating the adjustment made to the control gate voltage used for reading LSB data according to a first embodiment of the present invention. FIG. 11 is a diagram illustrating the operation of determining a shifting direction of the control gate voltage for finding a better control gate voltage used for reading LSB data according to a first embodiment of the present invention. Due to change of the threshold voltage distribution, the threshold voltages of some memory cells each originally programmed to have the electrical charge level L3 for storing LSB=1 are distributed in the voltage range V5-V9, and the threshold voltages of some memory cells each originally programmed to have the electrical charge level L4 for storing LSB=0 are distributed in the voltage range V1-V5. To have a minimum number of error bits presented in the readout information of the target physical page P_0, the control gate voltage for reading LSB data should be preferably set by V5 shown in FIG. 10 (i.e., VT 4' shown in FIG. 3). When the initial control gate voltage $V_{LSB}$ is set to V7 by the control unit 912 and the flash memory 102 performs the first read operation upon memory cells M_0-M_K according to the initial control gate voltage $V_{LSB}$, the number of error bits presented in the readout information (i.e., a first codeword CW_1 consisted of first bits of the bit sequences BS_0-BS_K) exceeds the maximum number of error bits that can be corrected by the ECC circuit 910. Thus, the threshold voltage distribution tracking mechanism is enabled accordingly. Next, the control unit 912 updates the initial control gate voltage $V_{LSB}$ employed by the first read operation by V6 which is lower than V7, and then controls the flash memory to perform the second read operation upon memory cells M_0-M_K according to the updated control gate voltage $V_{LSB}'$. Thus, a second codeword CW_2 consisted of second bits of the bit sequences BS_0-BS_K is received by the receiving circuit 908. Please note that the first codeword CW_1 is buffered in the storage device 918, and bits of the first codeword CW_1 buffered in the storage device 918 are transmitted to the comparing unit 916 one by one before overwritten by the incoming bits of the second codeword CW_2. The comparing unit 916 is arranged for comparing bits of the first codeword CW_1 (i.e., first bits of the bit sequences BS_0-BS_K) and bits of the second codeword CW_2 (i.e., second bits of the bit sequences BS_0-BS_K). The comparison result will indicate which bit position has one first bit flipping due to a transition from a first binary digit (e.g., "1") to a second binary digit (e.g., "0"). The counting unit 914 is coupled to the comparing unit 916 and the control unit 912, and is arranged for counting the number of first bit flipping between the first codeword CW_1 and the second codeword CW_2. That is, the counting unit 914 generates a first counter number N1 by counting the number of first bit flipping between first bits and second bits of the bit sequences BS_0-BS_K, wherein one first bit flipping occurs when the first bit and the second bit of one bit sequence have the first binary digit (e.g., "1") and the second binary digit (e.g., "0"), respectively.

Next, the control unit 912 updates the current control gate voltage $V_{LSB}$' employed by the second read operation by V8 which is higher than V7, and then controls the flash memory to perform the third read operation upon memory cells M_0-M_K according to the updated control gate voltage $V_{LSB}$". Thus, a third codeword CW_3 consisted of third bits of the bit sequences BS_0-BS_K is received by the receiving circuit 908. Please note that the first codeword CW_1 originally buffered in the storage device 918 will be overwritten by the second codeword CW_2; additionally, bits of the second codeword CW_2 buffered in the storage device 918 are transmitted to the comparing unit 916 one by one before overwritten by the incoming bits of the third codeword CW_3. The comparing unit 916 is further arranged for comparing bits of the second codeword CW_2 (i.e., second bits of the bit sequences BS_0-BS_K) and bits of the third codeword CW_3 (i.e., third bits of the bit sequences BS_0-BS_K). The comparison result will indicate which bit position has the second bit flipping due to a transition from the second binary digit (e.g., "0") to the first binary digit (e.g., "1"). The counting unit 914 is further arranged for counting the number of second bit flipping between the second codeword CW_2 and the third codeword CW_3. That is, the counting unit 914 generates a second counter number N2 by counting the number of second bit flipping between second bits and third bits of the bit sequences BS_0-BS_K, wherein one second bit flipping occurs when the second bit and the third bit of one bit sequence have the second binary digit (e.g., "0") and the first binary digit (e.g., "1"), respectively.

After receiving the first counter number N1 and the second counter number N2 generated from the counting unit 914, the control unit 912 determines the readout information which can pass the ECC parity check by referring to the first counter number N1 and the second counter number N2. For example, the control unit 912 determines the shifting direction DS of the control gate voltage according to the first counter number N1 and the second counter number N2. More specifically, as can be seen from FIG. 10, the first counter number N1 represents the total number of 0's newly identified due to shifting the control gate voltage from V7 to V6, and the second counter number N2 represents the total number of 1's newly identified due to shifting the control gate voltage from V6 to V8. Thus, the value (N2−N1) is representative of a total number of 1's resulted from shifting the control gate voltage from V7 to V8. In this exemplary embodiment, (N2−N1) is greater than N1, implying that the local minimum of the threshold voltage distribution corresponding to the electrical charge levels L3 and L4 is located on a left side of the initial control gate voltage $V_{LSB}$. Based on such an observation, the control unit 912 decides the shifting direction DS accordingly.

After the shifting direction DS is determined, the control logic 912 determines a new control gate voltage according to the shifting direction DS. When the readout information (i.e., a new codeword) obtained from applying the new control gate voltage to the control gate of each of the memory cells M_0-M_K of the target physical page P_0 passes the ECC parity check, this implies that the codeword processed by the ECC circuit 110 will become error-free. As the LSB data is successfully determined by the control unit 912 which updates the control gate voltage according to the shifting direction DS, the control unit 912 records the currently used control gate voltage as an initial control gate voltage to be used by the next LSB read operation performed upon the physical page P_0.

However, when the readout information (i.e., a new codeword) obtained from applying the new control gate voltage to the control gate of each of the memory cells M_0-M_K of the physical page P_0 fails to pass the ECC parity check, this implies that the codeword processed by the ECC circuit 110 still contains uncorrectable error bits, the control logic 912 will determine another control gate voltage according to the shifting direction DS. Updating the control gate voltage according to the shifting direction DS is not stopped until the codeword is error-free or all of the error bits presented in the codeword are correctable. Please note that the ECC circuit (e.g., a BCH decoder) 100 has error correction capability. Therefore, the control unit 912 is not required to exactly shift the control gate voltage to the optimum value V5 according to the shifting direction DS.

In above exemplary embodiment, the control unit 912 controls the flash memory 102 to perform the first read operation which utilizes the initial control gate voltage $V_{LSB}$, the second read operation which utilizes the lower control gate voltage $V_{LSB}$', and the third read operation which utilizes the higher control gate voltage $V_{LSB}$", sequentially. Therefore, the initial control gate voltage $V_{LSB}$, the lower control gate voltage $V_{LSB}$' and the higher control gate voltage $V_{LSB}$" are applied to the control gate of each of the memory cells M_0-M_K, sequentially. However, this is for illustrative purposes only, and is not meant to be a limitation of the present invention.

Figure 12:
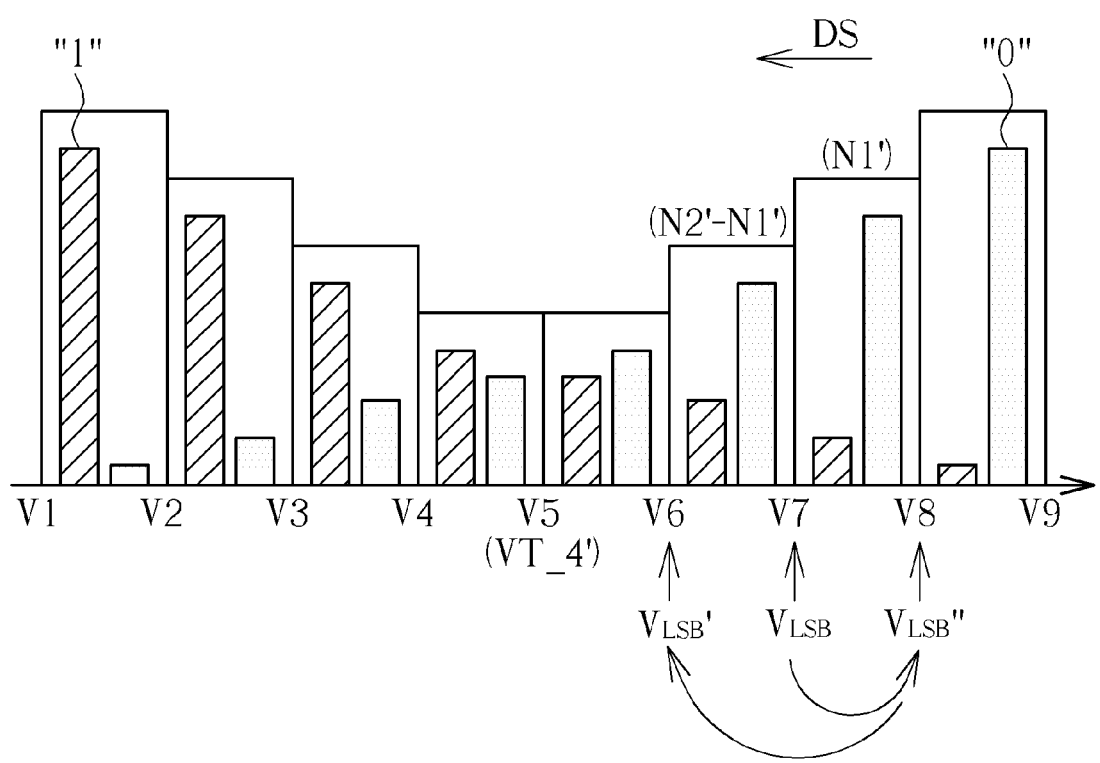
FIG. 12 is a diagram illustrating the adjustment made to the control gate voltage used for reading LSB data according to a second embodiment of the present invention.
Figure 13:
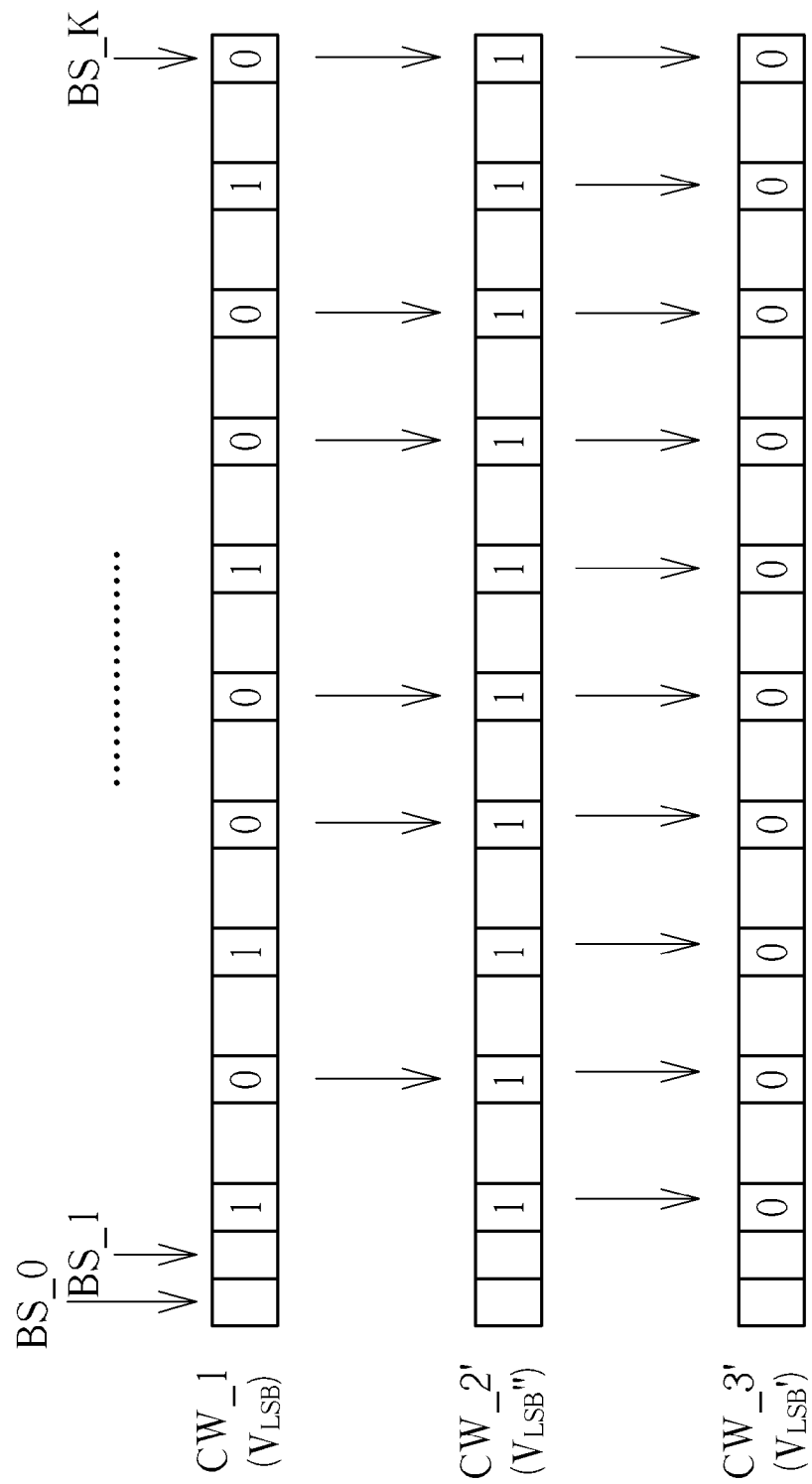
FIG. 13 is a diagram illustrating the operation of determining a shifting direction of the control gate voltage for finding a better control gate voltage used for reading LSB data according to a second embodiment of the present invention.

Please refer to FIG. 12 in conjunction with FIG. 13. FIG. 12 is a diagram illustrating the adjustment made to the control gate voltage used for reading LSB data according to a second embodiment of the present invention. FIG. 13 is a diagram illustrating the operation of determining a shifting direction of the control gate voltage for finding a better control gate voltage used for reading LSB data according to a second embodiment of the present invention. The major difference between the control gate voltage adjustment shown in FIG. 12 and the control gate voltage adjustment shown in FIG. 10 is that the control unit 912 controls the flash memory 102 to perform the first read operation which utilizes the initial control gate voltage $V_{LSB}$, the second read operation which utilizes the higher control gate voltage $V_{LSB}$", and the third read operation which utilizes the lower control gate voltage $V_{LSB}$', sequentially. Therefore, the initial control gate voltage $V_{LSB}$, the higher control gate voltage $V_{LSB}$" and the lower control gate voltage $V_{LSB}$' are applied to the control gate of each of the memory cells M_0-M_K, sequentially.

Similarly, when the initial control gate voltage $V_{LSB}$ is set to V7 by the control unit 912 and the flash memory 102 performs the first read operation upon memory cells M_0-M_K according to the initial control gate voltage $V_{LSB}$, the number of error bits presented in the readout information (i.e., a first codeword CW_1 consisted of first bits of the bit sequences BS_0-BS_K) exceeds the maximum number of error bits that can be corrected by the ECC circuit 910. Thus, the threshold voltage distribution tracking mechanism is enabled accordingly. Next, the control unit 912 updates the initial control gate voltage $V_{LSB}$ employed by the first read operation by V8 which is higher than V7, and then controls the flash memory 102 to perform the second read operation upon memory cells M_0-M_K according to the updated control gate voltage $V_{LSB}''$. Thus, a second codeword CW_2' consisted of second bits of the bit sequences BS_0-BS_K is received by the receiving circuit 908. The comparing unit 916 compares bits of the first codeword CW_1 (i.e., first bits of the bit sequences BS_0-BS_K) and bits of the second codeword CW_2' (i.e., second bits of the bit sequences BS_0-BS_K). The comparison result will indicate which bit position has the first bit flipping due to a transition from a first binary digit (e.g., "0") to a second binary digit (e.g., "1"). The counting unit 914 counts the number of first bit flipping between the first codeword CW_1 and the second codeword CW_2' to thereby obtain a first counter number N1'. Next, the control unit 912 updates the current control gate voltage $V_{LSB}''$ employed by the second read operation by V6 which is lower than V7, and then controls the flash memory 102 to perform the third read operation upon memory cells M_0-M_K according to the updated control gate voltage $V_{LSB}'$. Thus, a third codeword CW_3' consisted of third bits of the bit sequences BS_0-BS_K is received by the receiving circuit 908. The comparing unit 916 compares bits of the second codeword CW_2' (i.e., second bits of the bit sequences BS_0-BS_K) and bits of the third codeword CW_3' (i.e., third bits of the bit sequences BS_0-BS_K). The comparison result will indicate which bit position has the second bit flipping due to a transition from the second binary digit (e.g., "1") to the first binary digit (e.g., "0"). The counting unit 914 counts the number of second bit flipping between the second codeword CW_2' and the third codeword CW_3' to thereby obtain a second counter number N2'. As can be seen from FIG. 11 and FIG. 13, N1'=N2−N1 and N1=N2'−N1'. Thus, after receiving the first counter number N1' and the second counter number N2' generated from the counting unit 914, the control unit 912 would determine that the local minimum of the threshold voltage distribution corresponding to the electrical charge levels L3 and L4 is located on a left side of the initial control gate voltage $V_{LSB}$. The same objective of deciding the shifting direction DS of the control gate voltage is achieved.

Figure 14:
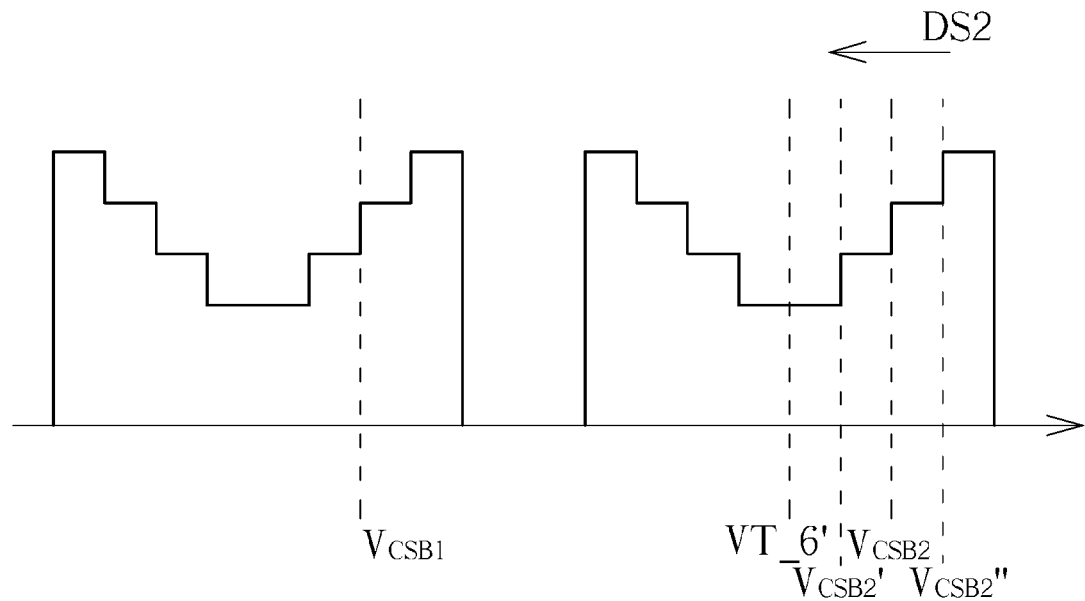
FIG. 14 is a diagram illustrating the adjustment made to one of the control gate voltages used for reading CSB data according to an embodiment of the present invention.

The operation of finding the best control gate voltage (s) used for reading the CSB data is detailed as follows. Please refer to FIG. 14, which is a diagram illustrating the adjustment made to one of the control gate voltages used for reading CSB data according to an embodiment of the present invention. As mentioned above, reading CSBs of memory cells M_0-M_K of the target physical page P_0 requires two control gate voltages $V_{CSB1}$ and $V_{CSB2}$. When the readout information of the physical page P_0 fails to pass the ECC parity check, it means that the CSBs read from the memory cells M_0-M_K include uncorrectable error bits. Thus, the threshold voltage distribution tracking mechanism is enabled to find better control gate voltage (s) used for reading the CSB data. In this exemplary embodiment, one of the control gate voltages $V_{CSB1}$ and $V_{CSB2}$ is not adjusted by the control unit 912, while the other of the control gate voltages $V_{CSB1}$ and $V_{CSB2}$ is adjusted by the control unit 912 to find the shifting direction of the control gate voltage. As shown in FIG. 14, under the condition where the control gate voltage $V_{CSB1}$ remains intact, the control gate voltage $V_{CSB2}$ is updated by the control unit 912 to find the shifting direction DS2. In one exemplary design, the first read operation which utilizes the initial control gate voltage $V_{CSB2}$, the second read operation which utilizes the lower control gate voltage $V_{CSB2}'$, and the third read operation which utilizes the higher control gate voltage $V_{CSB2}''$ are performed upon each of the memory cells M_0-M_K, sequentially. In an alternative exemplary design, the first read operation which utilizes the initial control gate voltage $V_{CSB2}$, the second read operation which utilizes the higher control gate voltage $V_{CSB2}''$, and the third read operation which utilizes the lower control gate voltage $V_{CSB2}'$ are performed upon each of the memory cells M_0-M_K, sequentially. The same objective of determining the shifting direction DS2 pointing to the local minimum of the threshold voltage distribution corresponding to the electrical charge levels L5 and L6 (i.e., the location where the best control gate voltage VT_6' is located) is achieved. As a person skilled in the art can readily understand how to determine the shifting direction DS2 by counting the first bit flipping between first bits and second bits of the bit sequences BS_0-BS_K and counting the second bit flipping between second bits and third bits of the bit sequences BS_0-BS_K after reading above paragraphs directed to finding the updated control gate voltage used for reading the LSB data, further description is omitted here for brevity.

When the best location of the control gate voltage (i.e., VT_6') has been found by the shifting direction DS2 and the ECC corrector 922 still indicates that the readout information obtained from using the best control gate voltage VT_6' and the initial control gate voltage $V_{CSB1}$ has uncorrectable errors, the control unit 912 keeps the best control gate voltage VT_6' intact, and starts updating the control gate voltage $V_{CSB1}$ to find the shifting direction DS1. Please refer to FIG. 15, which is a diagram illustrating the adjustment made to the other of the control gate voltages used for reading CSB data according to an embodiment of the present invention. In one exemplary design, the first read operation which utilizes the initial control gate voltage $V_{CSB1}$, the second read operation which utilizes the lower control gate voltage $V_{CSB1}'$, and the third read operation which utilizes the higher control gate voltage $V_{CSB1}''$ are performed upon each of the memory cells M_0-M_K, sequentially. In an alternative exemplary design, the first read operation which utilizes the initial control gate voltage $V_{CSB1}$, the second read operation which utilizes the higher control gate voltage $V_{CSB1}''$, and the third read operation which utilizes the lower control gate voltage $V_{CSB1}'$ are performed upon each of the memory cells M_0-M_K, sequentially. The same objective of determining the shifting direction DS1 pointing to the local minimum of the threshold voltage distribution corresponding to the electrical charge levels L1 and L2 (i.e., the location where the best control gate voltage VT_2' is located) is achieved. As a person skilled in the art can readily understand how to determine the shifting direction DS1 by counting the first bit flipping between first bits and second bits of the bit sequences BS_0-BS_K and counting the second bit flipping between second bits and third bits of the bit sequences BS_0-BS_K after reading above paragraphs directed to finding the updated control gate voltage used for reading the LSB data, further description is omitted here for brevity. Please note that the control unit 912 does not stop updating the control gate voltage according to the shifting direction DS1 until the ECC circuit 910 indicates that the readout information is error-free or the readout information has error bits that are correctable.

Figure 15:
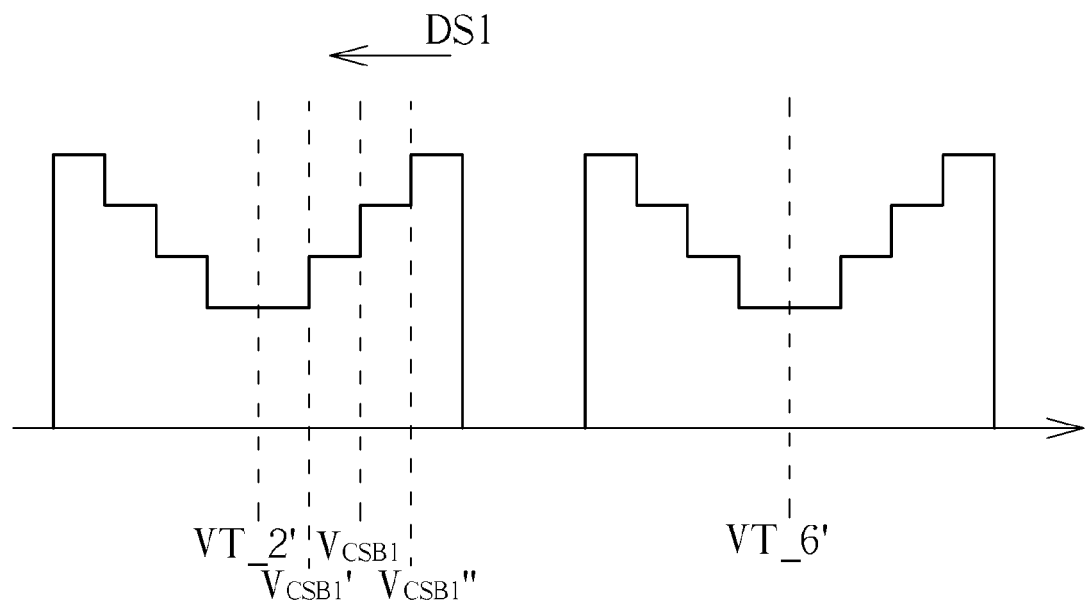
FIG. 15 is a diagram illustrating the adjustment made to the other of the control gate voltages used for reading CSB data according to an embodiment of the present invention.
Figure 16:
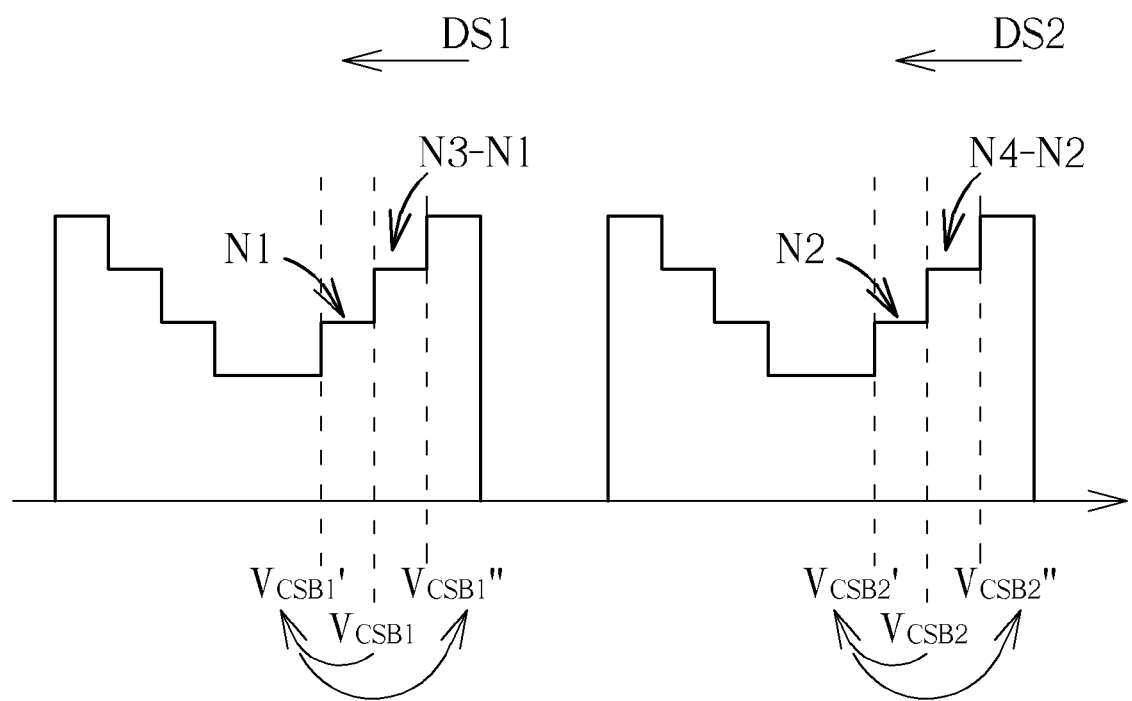
FIG. 16 is a diagram illustrating the adjustment made to both control gate voltages used for reading CSB data according to an embodiment of the present invention.
Figure 17:
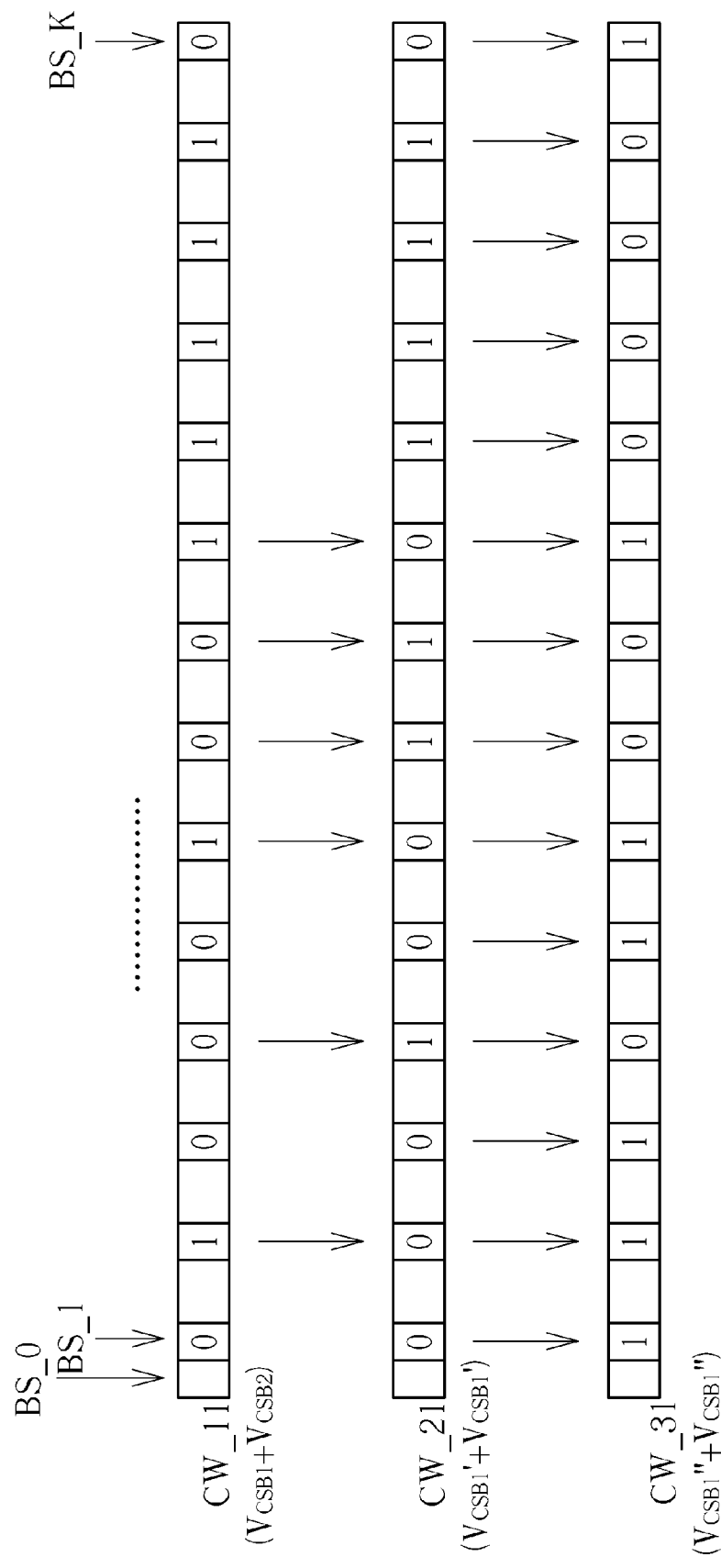
FIG. 17 is a diagram illustrating the operation of determining shifting directions of the control gate voltages for finding better control gate voltages used for reading CSB data according to an embodiment of the present invention.

In above examples shown in FIG. 14 and FIG. 15, one of the control gate voltages $V_{CSB1}$ and $V_{CSB2}$ is not adjusted by the control unit 912, while the other of the control gate voltages $V_{CSB1}$ and $V_{CSB2}$ is adjusted by the control unit 912 to find one shifting direction DS1/DS2. However, in an alternative design, the shifting directions DS1 and DS2 may be determined simultaneously. Please refer to FIG. 16 in conjunction with FIG. 17. FIG. 16 is a diagram illustrating the adjustment made to both control gate voltages used for reading CSB data according to an embodiment of the present invention. FIG. 17 is a diagram illustrating the operation of determining shifting directions of the control gate voltages for finding better control gate voltages used for reading CSB data according to an embodiment of the present invention. When the readout information of the physical page P_0 derived from using the initial control gate voltages $V_{CSB1}$ and $V_{CSB2}$ fails to pass the ECC parity check, it means that the CSBs read from the memory cells M_0-M_K include uncorrectable error bits. Thus, the threshold voltage distribution tracking mechanism is enabled to find better control gate voltage(s) used for reading the CSB data. As can be seen from the exemplary gray code design of the bits assigned to different electrical charge levels L0-L7 shown in FIG. 3, one of the control gate voltages should be set by a lower voltage corresponding to a local minimum of the threshold voltage distribution corresponding to the electrical charge levels L1 and L2, and the other of the control gate voltages should be set by a higher voltage corresponding to a local minimum of the threshold voltage distribution corresponding to the electrical charge levels L5 and L6. To discriminate between changed bits resulted from shifting the lower control gate voltage and changed bits resulted from shifting the higher control gate voltage, the adjustment made to the control gate voltages used for reading the CSB data should be properly configured according to the gray code design of the bits assigned to the electrical charge levels L1-L2 and L5 and L6. In this exemplary embodiment, the control unit 912 controls the flash memory 102 to perform the first read operation which utilizes two initial control gate voltages $V_{CSB1}$ and $V_{CSB2}$, the second read operation which utilizes one control gate voltage $V_{CSB1}'$ lower than the initial control gate voltage $V_{CSB1}$ and another control gate voltage $V_{CSB2}'$ lower than the initial control gate voltage $V_{CSB2}$, and the third read operation which utilizes one control gate voltage $V_{CSB1}''$ higher than the initial control gate voltage $V_{CSB1}$ and another control gate voltage $V_{CSB2}''$ higher than the initial control gate voltage $V_{CSB2}$, sequentially.

The comparing unit 916 compares the first bits and the second bits of the bit sequences BS_0-BS_K, wherein a first codeword CW_11 consisted of the first bits of the bit sequences BS_0-BS_K is obtained by the first read operation, and a second codeword CW_21 consisted of the second bits of the bit sequences BS_0-BS_K is are obtained by the second read operation. The comparison result will indicate which bit position has one first bit flipping due to a transition from a first binary digit (e.g., "1") to a second binary digit (e.g., "0"), and further indicate which bit position has one second bit flipping due to a transition from the second binary digit (e.g., "0") to the first binary digit (e.g., "1"). Please note that, in this exemplary embodiment, the first bit flipping is resulted from shifting the control gate voltage from $V_{CSB1}$ to $V_{CSB1}'$, and the second bit flipping is resulted from shifting the control gate voltage from $V_{CSB2}$ to $V_{CSB2}'$. The counting unit 914 counts the number of first bit flipping between the first codeword CW_11 and the second codeword CW_21, and also counts the number of second bit flipping between the first codeword CW_11 and the second codeword CW_21. That is, the counting unit 914 generates a first counter number N1 by counting the number of first bit flipping between first bits and second bits of the bit sequences BS_0-BS_K, and generates a second counter number N2 by counting the number of second bit flipping between first bits and second bits of the bit sequences BS_0-BS_K, wherein one first bit flipping occurs when the first bit and the second bit of one bit sequence have the first binary digit (e.g., "1") and the second binary digit (e.g., "0"), respectively, and one second bit flipping occurs when the first bit and the second bit of one bit sequence have the second binary digit (e.g., "0") and the first binary digit (e.g., "1"), respectively.

Besides, the comparing unit 916 compares the second bits and the third bits of the bit sequences BS_0-BS_K, wherein a third codeword CW_31 consisted of the third bits of the bit sequences BS_0-BS_K is obtained by the third read operation. The comparison result will indicate which bit position has one third bit flipping due to a transition from the second binary digit (e.g., "0") to the first binary digit (e.g., "1"), and further indicate which bit position has one fourth bit flipping due to a transition from the first binary digit (e.g., "1") to the second binary digit (e.g., "0"). Please note that, in this exemplary embodiment, the third bit flipping is resulted from shifting the control gate voltage from $V_{CSB1}'$ to $V_{CSB1}''$, and the fourth bit flipping is resulted from shifting the control gate voltage from $V_{CSB2}'$ to $V_{CSB2}''$. The counting unit 914 counts the number of third bit flipping between the second codeword CW_21 and the third codeword CW_31, and also counts the number of fourth bit flipping between the second codeword CW_21 and the third codeword CW_31. That is, the counting unit 914 generates a third counter number N3 by counting the number of third bit flipping between second bits and third bits of the bit sequences BS_0-BS_K, and generates a fourth counter number N4 by counting the number of fourth bit flipping between second bits and third bits of the bit sequences BS_0-BS_K, wherein one third bit flipping occurs when the second bit and the third bit of one bit sequence have the second binary digit (e.g., "0") and the first binary digit (e.g., "1"), respectively, and one fourth bit flipping occurs when the second bit and the third bit of one bit sequence have the first binary digit (e.g., "1") and the second binary digit (e.g., "0"), respectively.

After receiving the first counter number N1, the second counter number N2, the third counter number N3, and the fourth counter number N4 generated from the counting unit 914, the control unit 912 is capable of determining the shifting direction DS1 of one control gate voltage according to the first and third counter numbers N1 and N3, and determining the shifting direction DS2 of the other control gate voltage according to the second and fourth counter numbers N2 and N4. More specifically, the first counter number N1 represents the total number of 0's newly identified due to shifting the control gate voltage from $V_{CSB1}$ to $V_{CSB1}'$, the second counter number N2 represents the total number of 1's newly identified due to shifting the control gate voltage from $V_{CSB2}$ to $V_{CSB2}'$. Thus, the value (N3−N1) is representative of a total number of newly identified 1's resulted from shifting the control gate voltage from $V_{CSB1}$ to $V_{CSB1}''$, and the value (N4−N2) is representative of a total number of newly identified 0's resulted from shifting the control gate voltage from $V_{CSB2}$ to $V_{CSB2}''$. In this exemplary embodiment, (N3−N1) is greater than N1 and (N4−N2) is greater than N2, this implies that the local minimum of the threshold voltage distribution corresponding to the electrical charge levels L1 and L2 is located on a left side of the initial control gate voltage $V_{CSB1}$, and the local minimum of the threshold voltage distribution corresponding to the electrical charge levels L5 and L6 is located on a left side of the initial control gate voltage $V_{CSB2}$. Based on such an observation, the control unit 912 decides the shifting directions DS1 and DS2 simultaneously. Next, based on one or both of the shifting directions DS1 and DS2, the control unit 912 updates one or both of the control gate voltages to make the flash memory 102 generate readout information (i.e., CSBs) capable of passing the ECC parity check. As a person skilled in the art can readily understand the related operation after reading above paragraphs, further description is omitted here fore brevity.

In above exemplary embodiment, the control unit 912 controls the flash memory 102 to perform the first read operation which utilizes the initial control gate voltages $V_{CSB1}$ and $V_{CSB2}$, the second read operation which utilizes the control gate voltages $V_{CSB1}'$ and $V_{CSB2}'$, and the third read operation which utilizes the control gate voltages $V_{CSB1}''$ and $V_{CSB2}''$, sequentially. However, this is for illustrative purposes only, and is not meant to be a limitation of the present invention. In an alternative design, the control unit 912 is allowed to control the flash memory 102 to perform the first read operation which utilizes the initial control gate voltages $V_{CSB1}$ and $V_{CSB2}$, the second read operation which utilizes the control gate voltages $V_{CSB1}''$ and $V_{CSB2}''$, and the third read operation which utilizes the control gate voltages $V_{CSB1}'$ and $V_{CSB2}'$, sequentially. The same objective of determining the shifting directions DS1 and DS2 in a parallel processing manner is achieved. As a person skilled in the art can readily understand details of such an alternative design of determining shifting directions DS1 and DS2 after reading above paragraphs directed to the example of determining the shifting direction DS as shown in FIG. 12 and FIG. 13, further description is omitted here for brevity.

Figure 18:
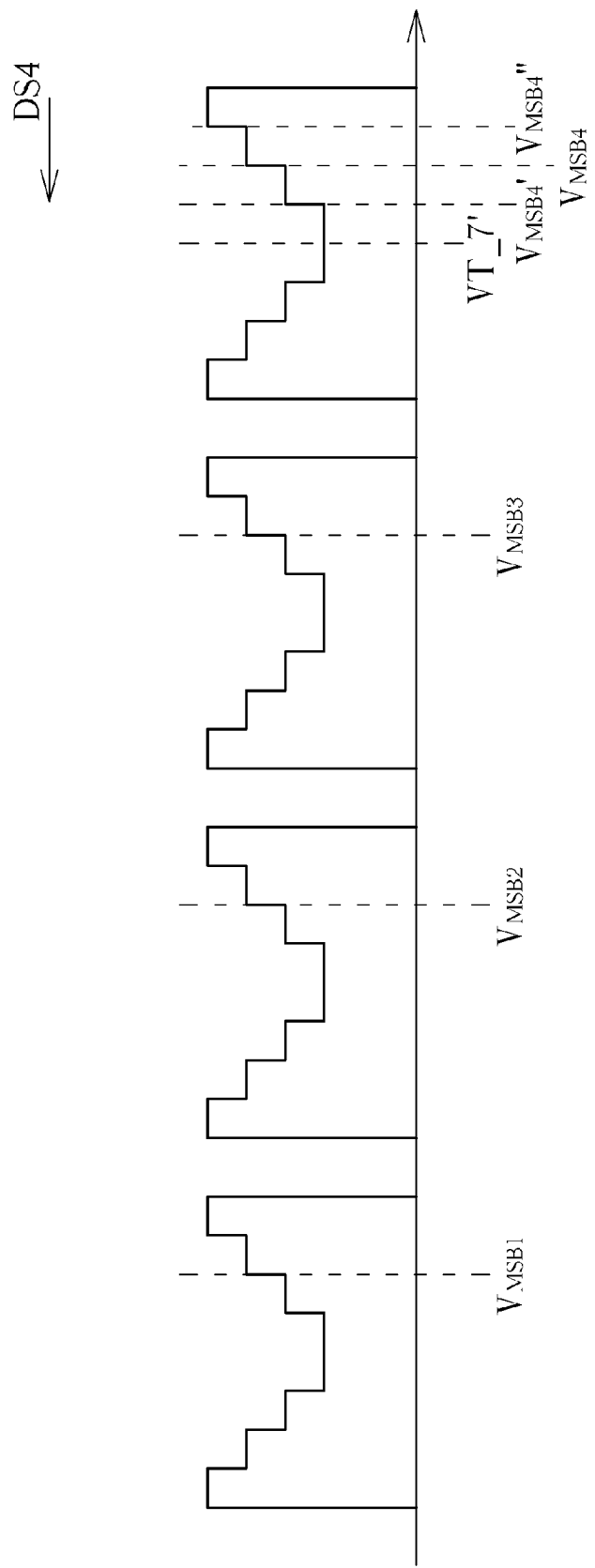
FIG. 18 is a diagram illustrating the adjustment made to one of the control gate voltages used for reading MSB data according to an embodiment of the present invention.

Regarding the case of reading MSBs of the memory cells M_0-M_K of the target physical page P_0, it is similar to the case of reading CSBs of the memory cells M_0-M_K as mentioned above. The major difference is that each read operation for reading the MSBs requires four control gate voltages rather than two control gate voltages. As mentioned above, reading MSBs of memory cells M_0-M_K of the target physical page P_0 requires four control gate voltages $V_{MSB1}$, $V_{MSB2}$, $V_{MSB3}$, and $V_{MSB4}$. When the readout information of the physical page P_0 fails to pass the ECC parity check, it means that the MSBs read from the memory cells M_0-M_K include uncorrectable error bits. Thus, the threshold voltage distribution tracking mechanism is enabled to find better control gate voltage (s) used for reading the MSB data. In one exemplary embodiment, one of the control gate voltages $V_{MSB1}$-$V_{MSB4}$ is adjusted by the control unit 912 to find the shifting direction of one control gate voltage, while the remaining voltages of the control gate voltages $V_{MSB1}$-$V_{MSB4}$ are not adjusted by the control unit 912. Please refer to FIG. 18, which is a diagram illustrating the adjustment made to one of the control gate voltages used for reading MSB data according to an embodiment of the present invention. As shown in FIG. 18, under the condition where the control gate voltages $V_{MSB1}$-$V_{MSB3}$ remain intact, the control gate voltage $V_{MSB4}$ is updated by the control unit 912 to $V_{MSB4}'$ and $V_{MSB4}''$ for finding the shifting direction DS4. When the best location of the control gate voltage (i.e., VT_7') has been found by the shifting direction DS4 and the ECC corrector 922 still indicates that the readout information obtained from using the best control gate voltage VT_7' and the initial control gate voltage $V_{MSB1}$-$V_{MSB3}$ has uncorrectable errors, the control unit 912 keeps the best control gate voltage VT_7' intact, and starts updating one of the control gate voltages $V_{MSB1}$-$V_{MSB3}$ to find another shifting direction.

Figure 19:
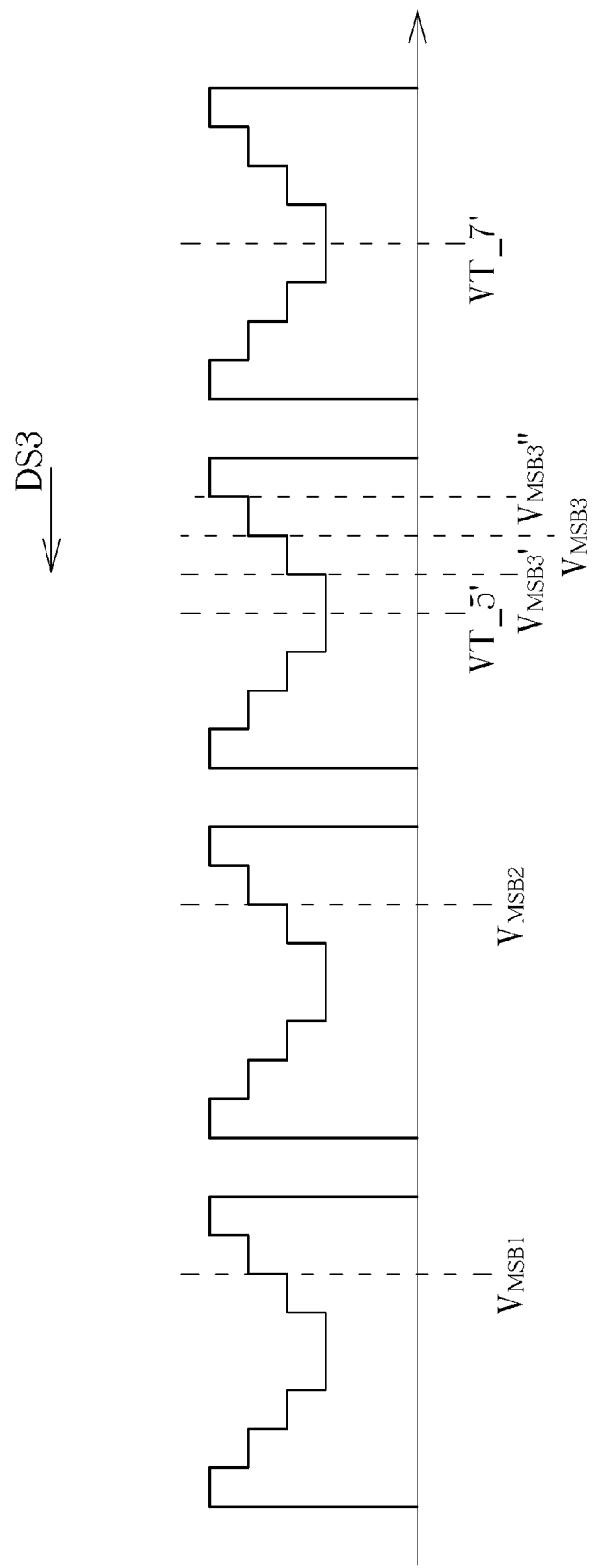
FIG. 19 is a diagram illustrating the adjustment made to another of the control gate voltages used for reading MSB data according to an embodiment of the present invention.

Please refer to FIG. 19, which is a diagram illustrating the adjustment made to another of the control gate voltages used for reading MSB data according to an embodiment of the present invention. As shown in FIG. 19, under the condition where the control gate voltages $V_{MSB1}$-$V_{MSB2}$ and VT_7' remain intact, the control gate voltage $V_{MSB3}$ is updated by the control unit 912 to $V_{MSB3}'$ and $V_{MSB3}''$ for finding the shifting direction DS3. When the best location of the control gate voltage (i.e., VT_5') has been found by the shifting direction DS3 and the ECC corrector 922 still indicates that the readout information obtained from using the best control gate voltages VT_7', VT_5' and the initial control gate voltage $V_{MSB1}$, $V_{MSB2}$ has uncorrectable errors, the control unit 912 keeps the best control gate voltages VT_7' and VT_5' intact, and starts updating one of the control gate voltages $V_{MSB1}$ and $V_{MSB2}$ to find another shifting direction.

Figure 20:
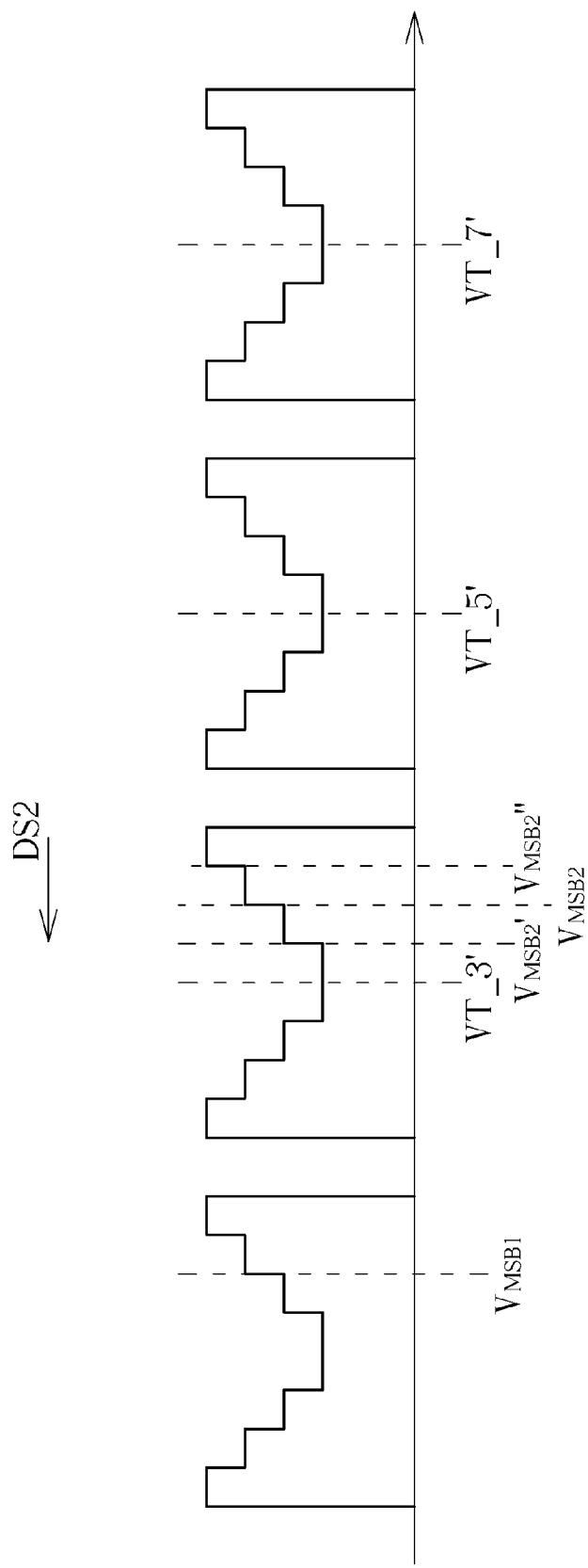
FIG. 20 is a diagram illustrating the adjustment made to yet another of the control gate voltages used for reading MSB data according to an embodiment of the present invention.

Please refer to FIG. 20, which is a diagram illustrating the adjustment made to yet another of the control gate voltages used for reading MSB data according to an embodiment of the present invention. As shown in FIG. 20, under the condition where the control gate voltages $V_{MSB1}$, VT_5', and VT_7' remain intact, the control gate voltage $V_{MSB2}$ is updated by the control unit 912 to $V_{MSB2}'$ and $V_{MSB2}''$ for finding the shifting direction DS2. When the best location of the control gate voltage (i.e., VT 3') has been found by the shifting direction DS2 and the ECC corrector 922 still indicates that the readout information obtained from using the best control gate voltages VT_7', VT_5', VT_3' and the initial control gate voltage $V_{MSB1}$ has uncorrectable errors, the control unit 912 keeps the best control gate voltages VT_7', VT_5', and VT_3' intact, and starts updating the last one control gate voltage $V_{MSB1}$ to find another shifting direction.

Figure 21:
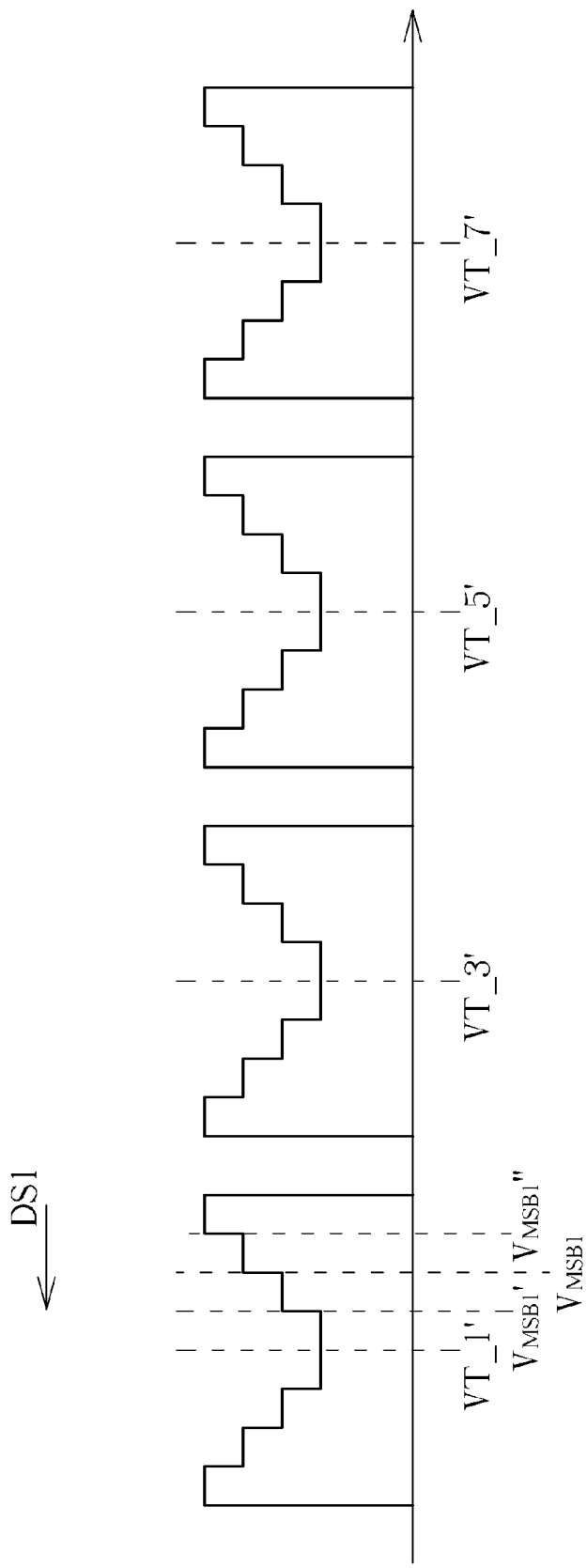
FIG. 21 is a diagram illustrating the adjustment made to a remaining one of the control gate voltages used for reading MSB data according to an embodiment of the present invention.

Please refer to FIG. 21, which is a diagram illustrating the adjustment made to a remaining one of the control gate voltages used for reading MSB data according to an embodiment of the present invention. As shown in FIG. 21, under the condition where the control gate voltages VT_3', VT_5', and VT_7' remain intact, the control gate voltage $V_{MSB1}$ is updated by the control unit 912 to $V_{MSB1}'$ and $V_{MSB1}''$ for finding the shifting direction DS1. After the shifting direction DS1 is determined, the control unit 912 does not stop updating the control gate voltage according to the shifting direction DS1 until the ECC circuit 910 indicates that the readout information is error-free or the readout information has error bits that are correctable.

As a person skilled in the art can readily understand detailed operations of determining the shifting direction DS4/DS3/DS2/DS1 and finding an updated control gate voltage according to the determined shifting direction DS4/DS3/DS2/DS1 after reading above paragraphs pertinent to the examples shown in FIG. 14 and FIG. 15, further description is omitted here for brevity.

Figure 22:
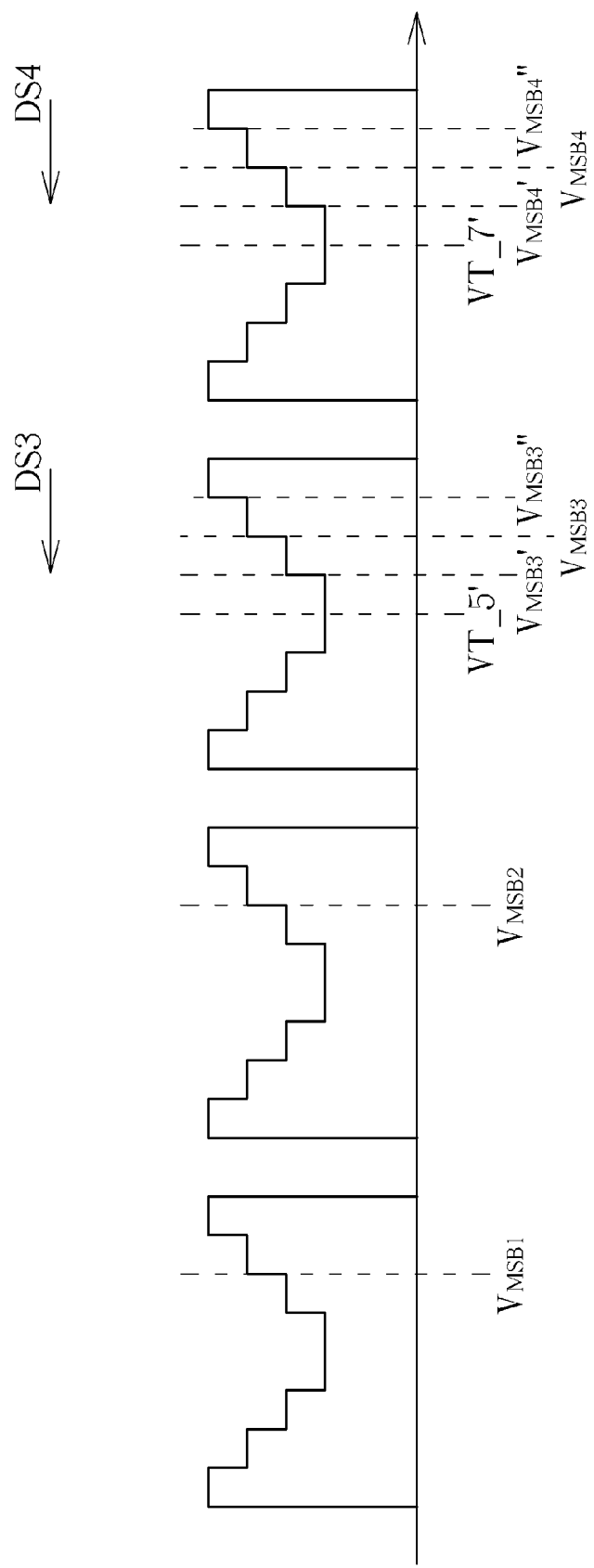
FIG. 22 is a diagram illustrating the adjustment made to two of the control gate voltages used for reading MSB data according to an embodiment of the present invention.

In above examples shown in FIGS. 18-21, one of the four control gate voltages is adjusted by the control unit 912 for finding a single shifting direction DS4/DS3/DS2/DS1, while the remaining voltages of the four control gate voltages remain intact. However, in an alternative, multiple shifting directions may be determined simultaneously. Please refer to FIG. 22, which is a diagram illustrating the adjustment made to two of the control gate voltages used for reading MSB data according to an embodiment of the present invention. In general, the shifting probability of the threshold voltage distribution corresponding to the upper electrical charge levels L4-L7 is greater than that of the threshold voltage distribution corresponding to the lower electrical charge levels L0-L3. Thus, in the beginning, the control gate voltages $V_{MSB1}$ and $V_{MSB2}$ are not adjusted by the control unit 912, and the control gate voltages $V_{MSB3}$ and $V_{MSB4}$ are adjusted by the control unit 912 to find the shifting directions DS3 and DS4 in a parallel processing manner. Similarly, to discriminate between changed bits resulted from shifting the lower control gate voltage $V_{MSB3}$ and changed bits resulted from shifting the higher control gate voltage $V_{MSB4}$, the adjustment made to the two control gate voltages $V_{MSB3}$ and $V_{MSB4}$ should be properly configured according to the gray code design of the bits assigned to the electrical charge levels L4-L7. In one exemplary design, the initial control gate voltage $V_{MSB3}$ is changed to $V_{MSB3}'$ and then changed to $V_{MSB3}''$, and the initial control gate voltage $V_{MSB4}$ is changed to $V_{MSB4}'$ and then changed to $V_{MSB4}''$. In another exemplary design, the initial control gate voltage $V_{MSB3}$ is changed to $V_{MSB3}''$ and then changed to $V_{MSB3}'$, and the initial control gate voltage $V_{MSB4}$ is changed to $V_{MSB4}''$ and then changed to $V_{MSB4}'$. The same objective of determining the shifting directions DS3 and DS4 simultaneously is achieved.

When the best locations of the control gate voltages (i.e., $VT\_5'$ and $VT\_7'$) have been found by the shifting directions DS3 and DS4, and the ECC corrector 922 still indicates that the readout information obtained from using the best control gate voltages $VT\_7'$, $VT\_5'$ and the initial control gate voltages $V_{MSB1}$ and $V_{MSB2}$ has uncorrectable errors, the control unit 912 keeps the best control gate voltages $VT\_7'$ and $VT\_5'$ intact, and starts updating the remaining two control gate voltages $V_{MSB1}$ and $V_{MSB2}$ to find other shifting directions DS1 and DS2 in a parallel processing manner.

Figure 23:
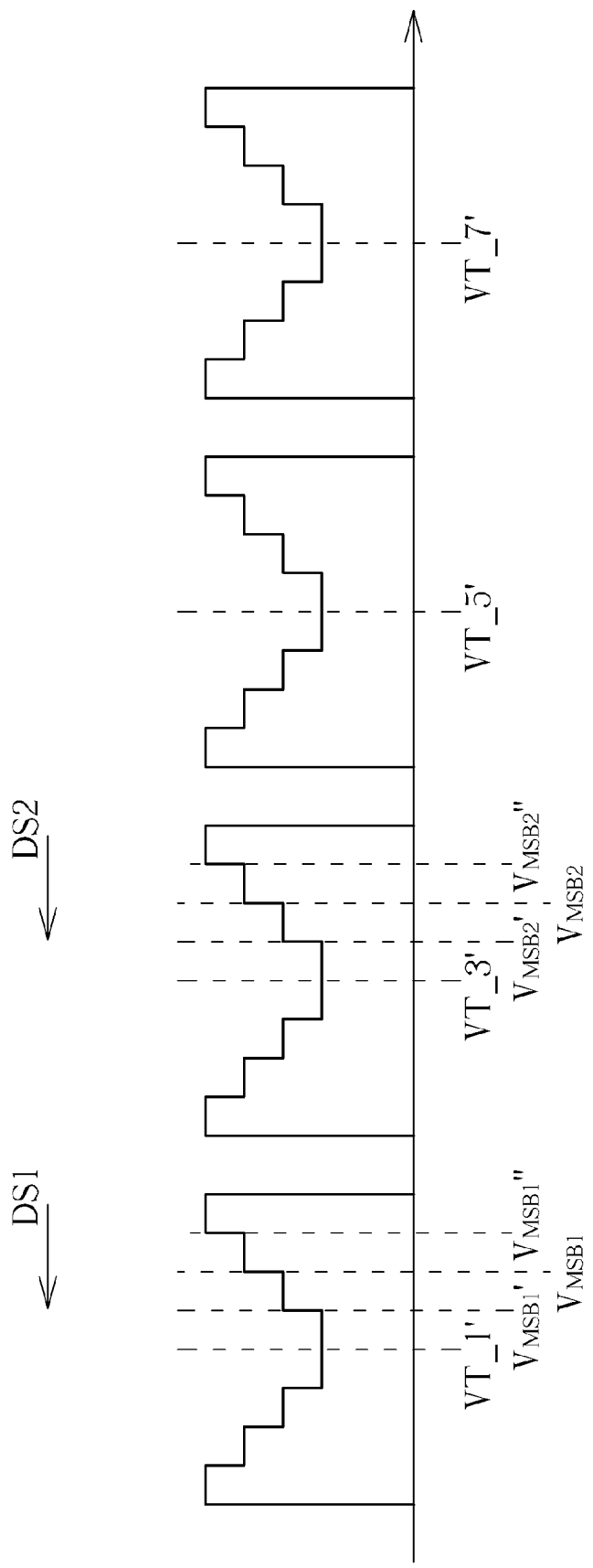
FIG. 23 is a diagram illustrating the adjustment made to the other two of the control gate voltages used for reading MSB data according to an embodiment of the present invention.

Please refer to FIG. 23, which is a diagram illustrating the adjustment made to the other two of the control gate voltages used for reading MSB data according to an embodiment of the present invention. The best control gate voltages $VT\_5'$ and $VT\_7'$ remain intact, and the control gate voltages $V_{MSB1}$ and $V_{MSB2}$ are adjusted by the control unit 912 to find the shifting directions DS1 and DS2. Similarly, to discriminate between changed bits resulted from shifting the lower control gate voltage $V_{MSB1}$ and changed bits resulted from shifting the higher control gate voltage $V_{MSB2}$, the adjustment made to the two control gate voltages $V_{MSB1}$ and $V_{MSB2}$ should be properly configured according to the gray code design of the bits assigned to the electrical charge levels L0-L3. In one exemplary design, the initial control gate voltage $V_{MSB1}$ is changed to $V_{MSB1}'$ and then changed to $V_{MSB1}''$, and the initial control gate voltage $V_{MSB2}$ is changed to $V_{MSB2}'$ and then changed to $V_{MSB2}''$. In another exemplary design, the initial control gate voltage $V_{MSB1}$ is changed to $V_{MSB1}''$ and then changed to $V_{MSB1}'$, and the initial control gate voltage $V_{MSB2}$ is changed to $V_{MSB2}''$ and then changed to $V_{MSB2}'$. The same objective of determining the shifting directions DS1 and DS2 simultaneously is achieved.

As a person skilled in the art can readily understand detailed operations of determining multiple shifting direction DS4 and DS3 (DS2 and DS1) and finding updated control gate voltages according to the determined shifting directions DS4 and DS3 (DS2 and DS1) after reading above paragraphs pertinent to the examples shown in FIG. 16 and FIG. 17, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading data stored in a flash memory, comprising:
   performing a plurality of read operations upon each of a plurality of memory cells of the flash memory to obtain a plurality of bit sequences respectively corresponding the memory cells, wherein the read operations utilizes a plurality of control gate voltages to read bits from each of the memory cells as one of the bit sequences; and
   determining readout information of the memory cells according to binary digit distribution characteristics of the bit sequences.

2. The method of claim 1, wherein the step of determining the readout information of the memory cells comprises:
   identifying a specific bit sequence of at least one specific memory cell of the memory cells, wherein each specific bit sequence has different binary digits included therein; and
   determining an updated bit sequence of the at least one specific memory cell according to at least the specific bit sequence.

3. The method of claim 2, wherein the step of determining the updated bit sequence of the at least one specific memory cell comprises:
   mapping the specific bit sequence to the updated bit sequence of the at least one specific memory cell.

4. The method of claim 1, wherein the step of determining the readout information of the memory cells comprises:
   for at least one of the control gate voltages, determining whether the control gate voltage is an optimum control gate voltage to identify bits of the memory cells.

5. The method of claim 4, further comprises:
   when it is determined that the control gate voltage is not the optimum control gate voltage, shifting the control gate voltages and utilizing the shifted control gate voltages to read bits from each of the memory cells.

6. The method of claim 1, wherein each of the read operations utilizes only one control gate voltage applied to a control gate of each of the memory cells, and the control gate voltage utilized by one of the read operations is different from the control gate voltage utilized by another of the read operations.

7. A memory controller for reading data stored in a flash memory, comprising:
   a receiving circuit, arranged for obtaining a plurality of bit sequences read from a plurality of memory cells of the flash memory, respectively; and
   a control logic, coupled to the receiving circuit, the control logic arranged for performing a plurality of read operations upon each of the memory cells, and determining readout information of the memory cells according to binary digit distribution characteristics of the bit sequences, wherein the read operations utilizes a plurality of control gate voltages to read bits from each of the memory cells as one of the bit sequences.

8. The memory controller of claim 7, wherein the control logic comprises:
   an identifying unit, arranged for identifying a specific bit sequence of at least one specific memory cell, wherein each specific bit sequence has different binary digits included therein; and
   a determining unit, coupled to the identifying unit, the determining unit arranged for determining an updated bit sequence of the at least one specific memory cell according to at least the specific bit sequence.

9. The memory controller of claim 8, wherein the determining unit determines the updated bit sequence of the at least one specific memory cell by mapping the specific bit sequence to the updated bit sequence.

10. The memory controller of claim 7, wherein for at least one of the control gate voltages, the determining unit determines whether the control gate voltage is an optimum control gate voltage to identify bits of the memory cells.

11. The memory controller of claim 10, wherein when the determining unit determines that the control gate voltage is not the optimum control gate voltage, a control unit of the control logic shifts the control gate voltages and utilizes the shifted control gate voltages to read bits from each of the memory cells.

12. The memory controller of claim 7, wherein each of the read operations utilizes only one control gate voltage applied to a control gate of each of the memory cells, and the control gate voltage utilized by one of the read operations is different from the control gate voltage utilized by another of the read operations.

13. A memory system, comprising:
a flash memory; and
a memory controller, coupled to the flash memory, wherein the memory controller comprises:
- a receiving circuit, arranged for obtaining a plurality of bit sequences read from a plurality of memory cells of the flash memory, respectively; and
- a control logic, coupled to the receiving circuit, the control logic arranged for performing a plurality of read operations upon each of the memory cells, and determining readout information of the memory cells according to binary digit distribution characteristics of the bit sequences, wherein the read operations utilizes a plurality of control gate voltages to read bits from each of the memory cells as one of the bit sequences.

14. The memory system of claim 13, wherein the control logic comprises:
- an identifying unit, arranged for identifying a specific bit sequence of at least one specific memory cell, wherein each specific bit sequence has different binary digits included therein; and
- a determining unit, coupled to the identifying unit, the determining unit arranged for determining an updated bit sequence of the at least one specific memory cell according to at least the specific bit sequence.

15. The memory system of claim 14, wherein the determining unit determines the updated bit sequence of the at least one specific memory cell by mapping the specific bit sequence to the updated bit sequence.

16. The memory system of claim 13, wherein for at least one of the control gate voltages, the determining unit determines whether the control gate voltage is an optimum control gate voltage to identify bits of the memory cells.

17. The memory system of claim 16, wherein when the determining unit determines that the control gate voltage is not the optimum control gate voltage, a control unit of the control logic shifts the control gate voltages and utilizes the shifted control gate voltages to read bits from each of the memory cells.

18. The memory system of claim 13, wherein each of the read operations utilizes only one control gate voltage applied to a control gate of each of the memory cells, and the control gate voltage utilized by one of the read operations is different from the control gate voltage utilized by another of the read operations.

* * * * *